(12) United States Patent
Kondo et al.

(10) Patent No.: US 10,843,464 B2
(45) Date of Patent: Nov. 24, 2020

(54) ELECTROMECHANICAL TRANSDUCER ELEMENT, LIQUID DISCHARGE HEAD, LIQUID DISCHARGE APPARATUS

(71) Applicants: Naoya Kondo, Kanagawa (JP); Takuma Hirabayashi, Kanagawa (JP)

(72) Inventors: Naoya Kondo, Kanagawa (JP); Takuma Hirabayashi, Kanagawa (JP)

(73) Assignee: Ricoh Company, Ltd., Tokyo (JP)

( * ) Notice: Subject to any disclaimer, the term of this patent is extended or adjusted under 35 U.S.C. 154(b) by 0 days.

(21) Appl. No.: 16/519,171

(22) Filed: Jul. 23, 2019

(65) Prior Publication Data

US 2020/0031113 A1 Jan. 30, 2020

(30) Foreign Application Priority Data

Jul. 27, 2018 (JP) .................................. 2018-141123
Jun. 6, 2019 (JP) .................................. 2019-106099

(51) Int. Cl.
*B41J 2/14* (2006.01)
*H01L 41/187* (2006.01)
*H01L 41/08* (2006.01)
*H01L 41/318* (2013.01)
*H01L 41/332* (2013.01)
*H01L 41/257* (2013.01)
*H01L 41/09* (2006.01)

(52) U.S. Cl.
CPC ...... *B41J 2/14233* (2013.01); *H01L 41/0805* (2013.01); *H01L 41/0973* (2013.01); *H01L 41/1876* (2013.01); *H01L 41/257* (2013.01); *H01L 41/318* (2013.01); *H01L 41/332* (2013.01); *B41J 2202/03* (2013.01)

(58) Field of Classification Search
CPC . B41J 2/14233; B41J 2202/03; H01L 41/257; H01L 41/0973; H01L 41/0805; H01L 41/1876; H01L 41/318; H01L 41/332
See application file for complete search history.

(56) References Cited

U.S. PATENT DOCUMENTS

2013/0002767 A1    1/2013   Mizukami et al.
2015/0077475 A1    3/2015   Mizukami et al.
(Continued)

FOREIGN PATENT DOCUMENTS

JP     10-226071     8/1998
JP     2005-244174     9/2005
(Continued)

*Primary Examiner* — Geoffrey S Mruk
(74) *Attorney, Agent, or Firm* — Oblon, McClelland, Maier & Neustadt, L.L.P.

(57) ABSTRACT

An electromechanical transducer element includes an electromechanical transducer film including a complex oxide that has a perovskite structure containing at least Pb, Zr and Ti; a pair of electrodes disposed to sandwich the electromechanical transducer film; and an insulating protective film covering the electromechanical transducer film and the pair of electrodes. Pb content of the electromechanical transducer film is uniform in a film thickness direction of the electromechanical transducer film, and a density of leak current measured between the pair of electrodes is $4.2 \times 10^{-6}$ A/cm$^2$ or less in an environment in which a water vapor pressure is 300 kPa.

13 Claims, 11 Drawing Sheets

(56) References Cited

U.S. PATENT DOCUMENTS

| | | | |
|---|---|---|---|
| 2015/0263263 A1 | 9/2015 | Akiyama et al. | |
| 2015/0266296 A1 | 9/2015 | Mizukami et al. | |
| 2015/0283811 A1 | 10/2015 | Kondo | |
| 2016/0263893 A1 | 9/2016 | Mizukami et al. | |
| 2016/0339694 A1 | 11/2016 | Kihira et al. | |
| 2017/0144435 A1 | 5/2017 | Kondo | |
| 2017/0225461 A1 | 8/2017 | Kondo et al. | |
| 2017/0334205 A1* | 11/2017 | Mizukami | H01L 41/316 |
| 2018/0370237 A1 | 12/2018 | Mizukami et al. | |
| 2019/0044055 A1 | 2/2019 | Kondo et al. | |

FOREIGN PATENT DOCUMENTS

| | | |
|---|---|---|
| JP | 2007-276384 | 10/2007 |
| JP | 2007-335779 | 12/2007 |
| JP | 2008-305821 | 12/2008 |
| JP | 2013-016738 | 1/2013 |
| WO | WO2003/070641 A1 | 8/2003 |
| WO | WO2005/031886 A1 | 4/2005 |

\* cited by examiner

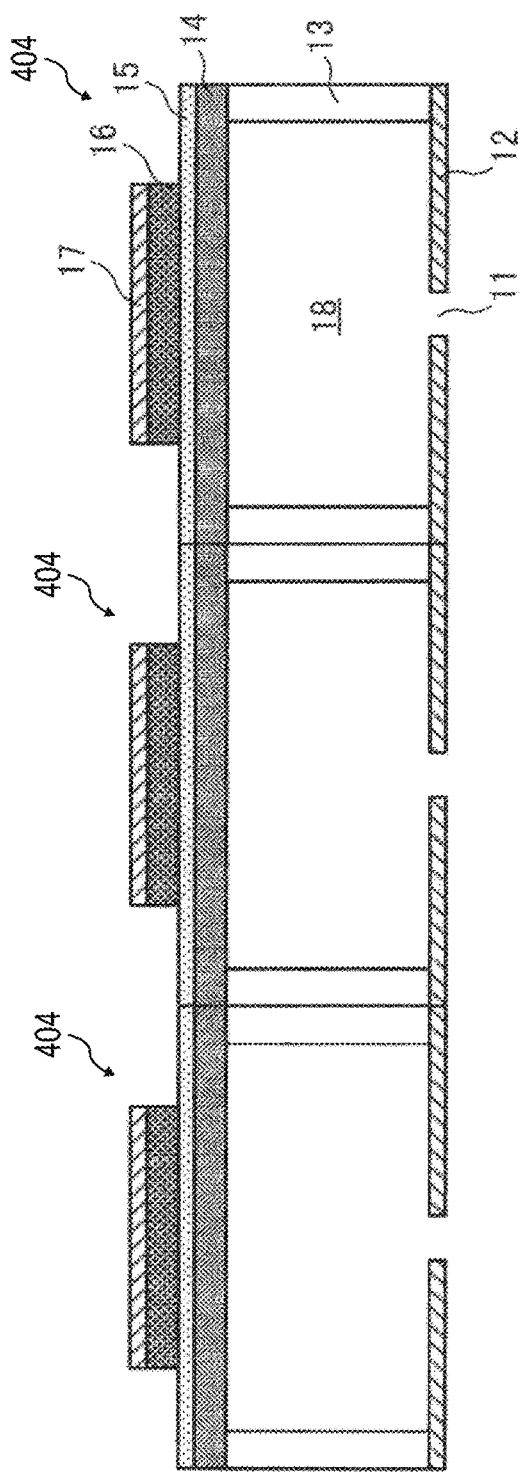
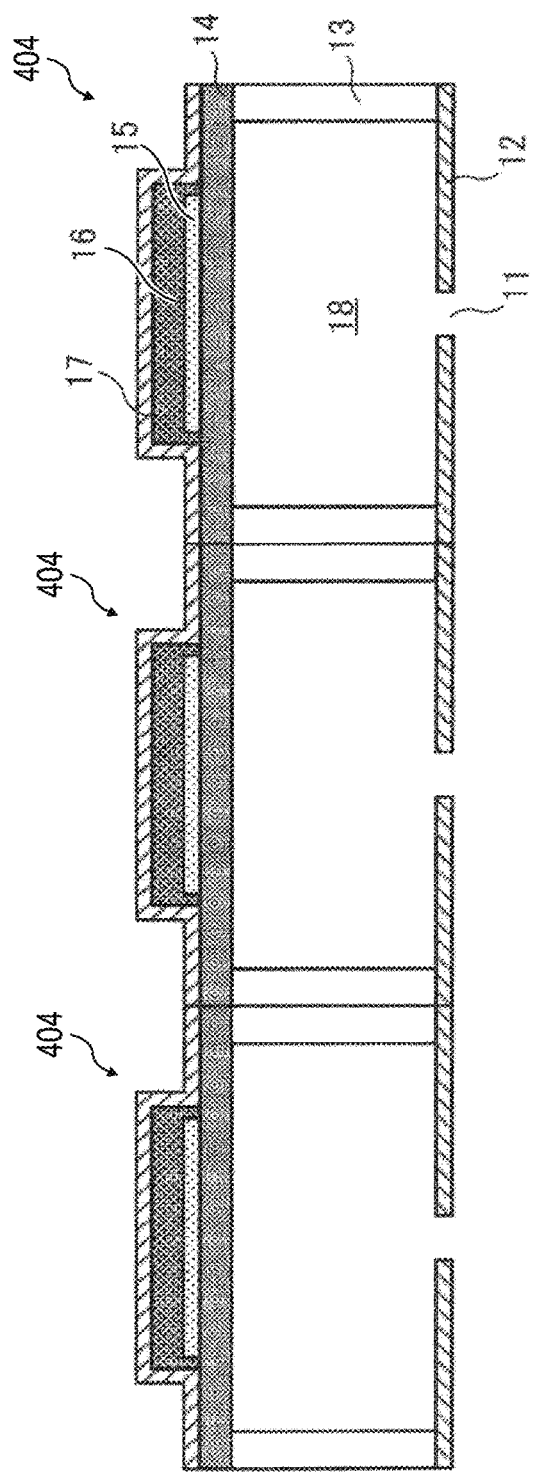

ELECTROMECHANICAL TRANSDUCER ELEMENT, LIQUID DISCHARGE HEAD, LIQUID DISCHARGE APPARATUS

CROSS-REFERENCE TO RELATED APPLICATIONS

This patent application is based on and claims priority pursuant to 35 U.S.C. § 119(a) to Japanese Patent Application No. 2018-141123, filed on Jul. 27, 2018, and Japanese Patent Application No. 2019-106099, filed on Jun. 6, 2019, in the Japan Patent Office, the entire disclosure of each of which is hereby incorporated by reference herein.

BACKGROUND

Technical Field

The present disclosure relates to an electromechanical transducer, a liquid discharge head, and a liquid discharge apparatus.

Related Art

Ink jet recording apparatuses and liquid discharge heads (hereinafter simply referred to as a "head") used in image recording apparatuses or image forming apparatuses, such as printers, facsimiles, copiers, etc., include nozzles from which to discharge ink droplets, a pressure chamber (an ink channel, a pressure chamber, a discharge chamber, a liquid chamber, etc.) behind the nozzles, and an energy generator (for example, a piezoelectric element as an electromechanical transducer element) to pressurize ink in the pressure chamber. The head using such an electromechanical transducer element pressurizes the liquid in the pressure chamber with the energy generated in the energy generator to discharges ink droplets from the nozzles.

There are two types of heads: One that employs an actuator, including an electromechanical transducer element (piezoelectric element) actuating in a vertical vibration mode to extend or contract in an axial direction of the electromechanical transducer element, and a head that employs an actuator including an electromechanical transducer element (piezoelectric element) actuating in a bending vibration mode.

To form the actuator including the electromechanical transducer element (piezoelectric element) actuating in the bending vibration mode, a uniform electromechanical transducer film (also referred to as a "piezoelectric film" or a "piezoelectric material layer") is formed over the entire surface of a diaphragm by a film forming technique, for example. Then, the uniform electromechanical transducer film is sliced into a plurality of separate and independent electromechanical transducer elements using lithography corresponding to a respective one of a plurality of pressure chambers.

SUMMARY

In an aspect of this disclosure, a novel electromechanical transducer element includes an electromechanical transducer film including a complex oxide that has a perovskite structure containing at least Pb, Zr and Ti, a pair of electrodes disposed to sandwich the electromechanical transducer film, and an insulating protective film covering the electromechanical transducer film and the pair of electrodes. The Pb content of the electromechanical transducer film is uniform in a film thickness direction of the electromechanical transducer film, and a density of leak current measured between the pair of electrodes is $4.2 \times 10^{-6}$ A/cm$^2$ or less in an environment in which water vapor pressure is 300 kPa.

BRIEF DESCRIPTION OF THE DRAWINGS

The aforementioned and other aspects, features, and advantages of the present disclosure will be better understood by reference to the following detailed description when considered in connection with the accompanying drawings, wherein:

FIGS. 7A and 7B are schematic cross-sectional views of a configuration example of a liquid discharge head;

Figure 1:
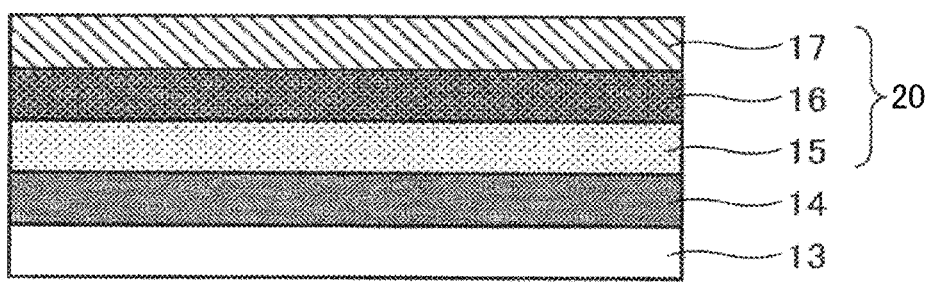
FIG. 1 is a schematic cross-sectional view of a configuration example of an electromechanical transducer element according to the present disclosure.

The accompanying drawings are intended to depict embodiments of the present disclosure and should not be interpreted to limit the scope thereof. The accompanying drawings are not to be considered as drawn to scale unless explicitly noted.

DETAILED DESCRIPTION

In describing embodiments illustrated in the drawings, specific terminology is employed for the sake of clarity. However, the disclosure of this patent specification is not intended to be limited to the specific terminology so selected and it is to be understood that each specific element includes all technical equivalents that have the same function, operate in an analogous manner, and achieve similar results.

Although the embodiments are described with technical limitations with reference to the attached drawings, such description is not intended to limit the scope of the disclosure and all the components or elements described in the embodiments of this disclosure are not necessarily indispensable. As used herein, the singular forms "a", "an", and "the" are intended to include the plural forms as well, unless the context clearly indicates otherwise.

The following embodiments may be modified by, e.g., addition, modification, or omission within the scope that would be obvious to one skilled in the art. Any aspects having advantages as described in the following embodiments are included within the scope of the present disclosure.

Hereinafter, an electromechanical transducer element, a liquid discharge head, a liquid discharge apparatus according to an embodiment of the present disclosure is described with reference to the drawings.

The electromechanical transducer element according to the present disclosure may be applied to an apparatus including a thin-film type electromechanical transducer film made of a piezoelectric body. For example, the electromechanical transducer element may be used for a piezoelectric device such as a head, a motor, an ultrasonic transducer, a piezoelectric sensor, a ferroelectric memory, a generator, a speaker, and the like.

The piezoelectric body constituting the electromechanical transducer film is made of a material having a piezoelectric property which is deformed by an application of a voltage.

The electromechanical transducer film according to the present disclosure includes a composite oxide having a structure of perovskite including at least materials of Pb, Zr, and Ti, such as lead zirconate titanate (PZT).

As a vibration mode when a drive voltage is applied to an electromechanical transducer element including an electromechanical transducer film made of PZT, there is, for example, a vertical vibration mode (push mode) accompanied by deformation in a film thickness direction by a piezoelectric constant d33 and a lateral vibration mode (bend mode) accompanied by bending deformation by a piezoelectric constant d31.

Furthermore, there is also a shear mode using a shear deformation of a film as a vibration mode, for example.

The electromechanical transducer element including an electromechanical transducer film can be directly formed on a silicon (Si) substrate using a technology of a semiconductor process or Micro Electro Mechanical Systems (MEMS). The pressure chamber also can be directly formed on the silicon (Si) substrate. Thus, the electromechanical transducer element can be formed as a thin-film piezoelectric actuator that generates pressure in the pressure chamber of the head, for example.

FIG. 1 is a cross-sectional view of an example of a schematic configuration of an electromechanical transducer element.

In an example illustrated in FIG. 1, a substrate 13, a diaphragm 14, and an electromechanical transducer element 20 are laminated one atop the other, in that order, and the electromechanical transducer element 20 includes a first electrode 15, an electromechanical transducer film 16, and a second electrode 17.

Figure 2A:
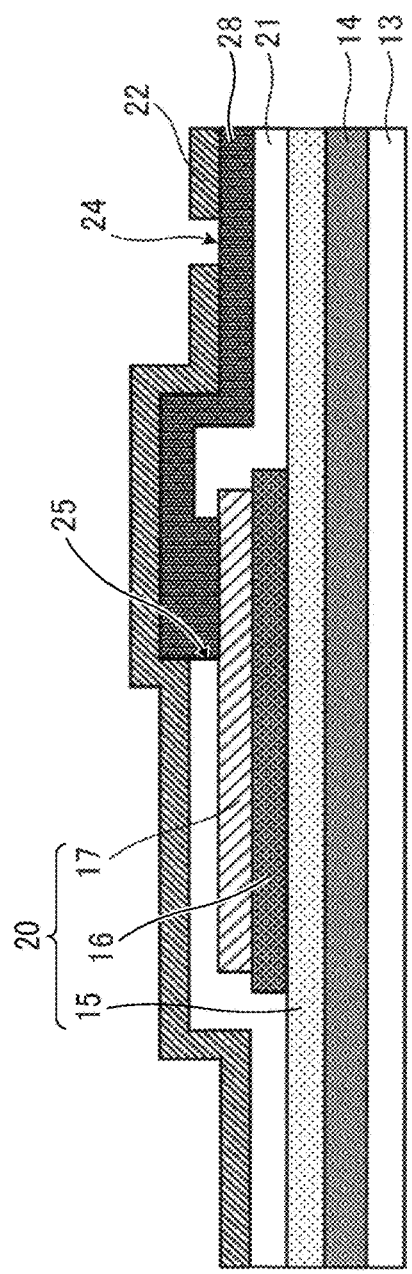
FIGS. 2A and 2B are a cross-sectional view and a top view of the configuration example of the electromechanical transducer element according to the present disclosure.
Figure 2B:
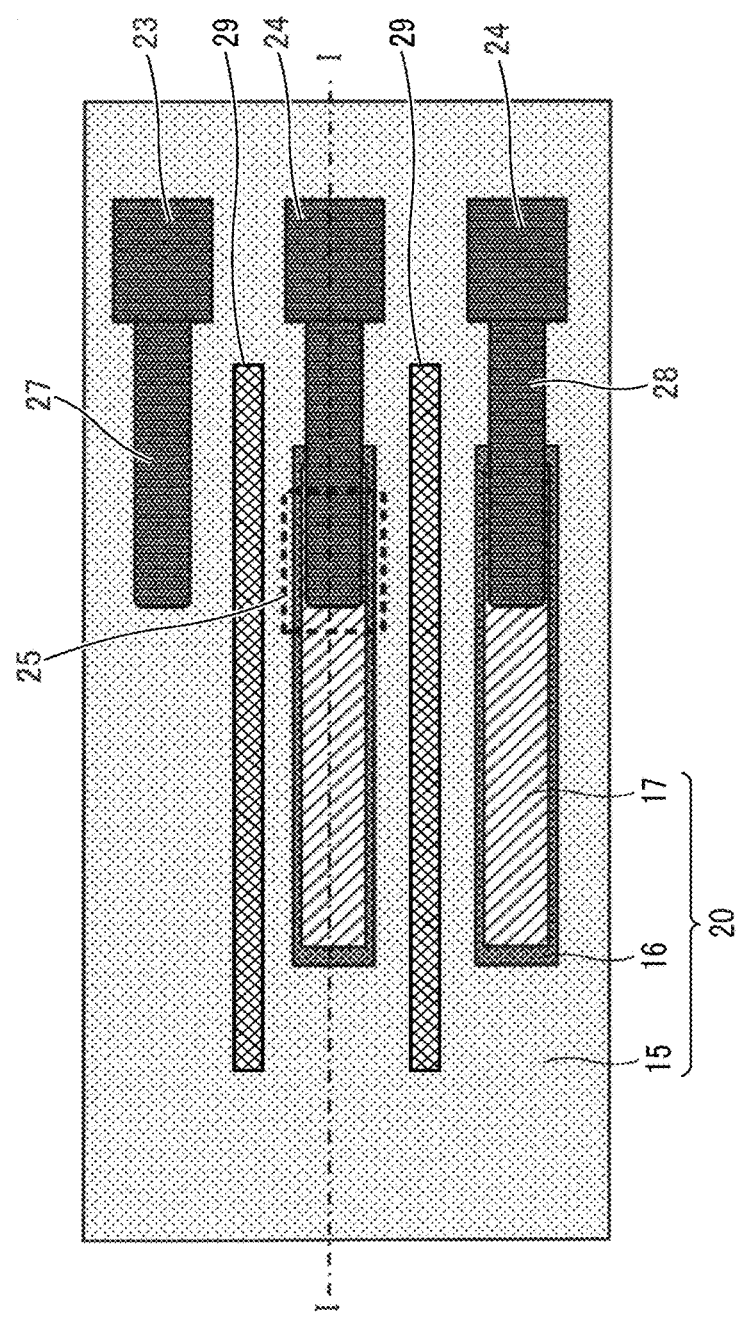

FIGS. 2A and 2B illustrate an example of a configuration of a piezoelectric actuator such as a head including the electromechanical transducer element 20 according to the present disclosure. FIG. 2A is a cross-sectional view of an example of a schematic configuration of the electromechanical transducer element 20 in a liquid discharge head according to the present disclosure. Specifically, FIG. 2A is a cross-sectional view of the electromechanical transducer element 20 along line I-I in FIG. 2B. FIG. 2B is a plan view of the electromechanical transducer element 20 of FIG. 2A.

As illustrated in FIG. 2B, a plurality of electromechanical transducer elements 20 is arrayed in a predetermined direction along a surface of the substrate 13. The plurality of electromechanical transducer elements 20 are formed on the substrate 13 with the diaphragm 14 interposed between the plurality of electromechanical transducer elements 20 and the substrate 13.

The plurality of electromechanical transducer elements 20 includes a first insulating protective film 21 as an interlayer insulating film formed in a predetermined area of the electromechanical transducer film 16 and a pair of electrodes (a first electrode 15 and a second electrode 17).

A contact hole 25 is formed in the first insulating protective film 21 to enable the first electrode 15 and the second electrode 17 to be electrically connected to other electrodes.

In FIGS. 2A and 2B, the first electrode 15 is electrically connected to a third electrode 27 (common lead-out wiring). Further, the second electrode 17 is electrically connected to a fourth electrode 28 (common lead-out wiring). Further, the plurality of electromechanical transducer elements 20 includes a second insulating protective film 22 to protect a common electrode and an individual electrode. The common electrode includes the first electrode 15 and the third electrode 27, and the individual electrode includes the second electrode 17 and the fourth electrode 28.

A part of the second insulating protective film 22 includes an opening. A part of the individual electrode includes an individual electrode pad 24. A part of the common electrode includes a common electrode pad 23. The first insulating protective film 21 and the second insulating protective film 22 are illustrated in FIG. 2A.

The first insulating protective film 21 and the second insulating protective film 22 can be made of an inorganic compound such as aluminum oxide, silicon oxide, aluminum nitride, and silicon nitride.

In the examples illustrated in FIGS. 1 and 2, the first electrode 15 (lower electrode) is a common electrode and the second electrode 17 (upper electrode) is an individual electrode. However, as illustrated in a configuration in FIGS. 6A and 6B below, either one of the first electrode 15 (lower electrode) and the second electrode 17 (upper electrode) may be the common electrode, and another of the first electrode 15 (lower electrode) and the second electrode 17 (upper electrode) may be the individual electrode. Thus, functions (common electrode or individual electrode) of the first electrode 15 (lower electrode) and the second electrode 17 (upper electrode) may be appropriately changed according to the purpose.

[Substrate]

The material used for the substrate 13 is not particularly limited. However, the substrate 13 is preferably made of a silicon single crystal substrate having a thickness of 100 to 600 µm. As plane orientations, there are three types of (100), (110), and (111) plane orientation. The (100) and (111) plane orientations are widely used in the semiconductor industry in general. Preferably, the single crystal substrate having (100) plane is used in the present disclosure.

Figure 6A:
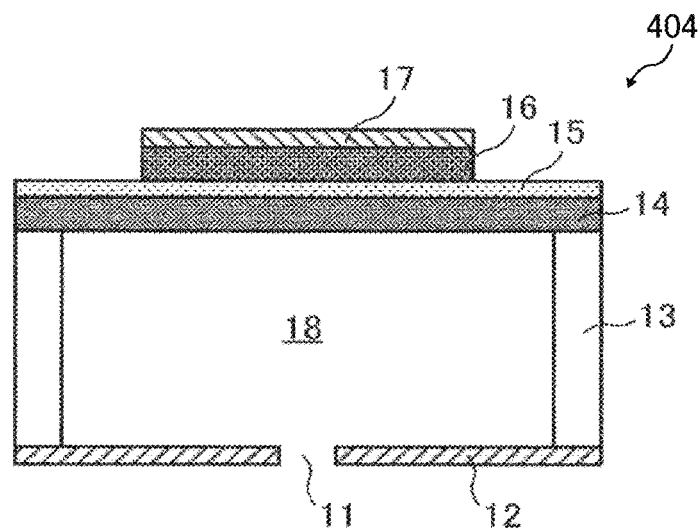
FIGS. 6A and 6B are schematic cross-sectional views of a configuration example of a liquid discharge head.
Figure 6B:
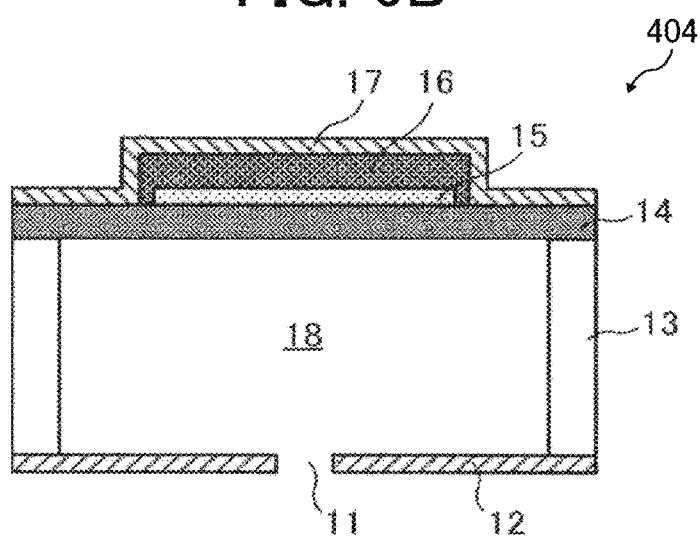

When a pressure chamber 18 is formed in a head 404 as illustrated in FIGS. 6A and 6B as described below, the silicon single crystal substrate is processed using etching. Anisotropic etching is typically used as a method of etching the silicon single crystal substrate to form the pressure chamber 18. Anisotropic etching takes advantage of the fact that etching rates differ with respect to the plane orientation of the crystal structure.

For example, in the anisotropic etching in which the silicon single crystal substrate is immersed in an alkaline solution, such as KOH, the etching rate of a (111) plane is about 1/400 of the etching rate of a (100) plane. Therefore, while a structure having an inclination of about 54° can be produced in the plane orientation (100), a deep groove can be removed in the plane orientation (110). Thus, an arrangement density can be increased while maintaining rigidity.

In such a case, the silicon single crystal substrate having (110) plane orientation is used by paying attention to a fact that silicon dioxide ($SiO_2$) as a mask material may also be etched.

A width (length in a transverse direction) of the pressure chamber 18 is preferably 50 μm or more and 70 μm or less. The liquid discharge head can reliably discharge a liquid at high frequency if the width of the pressure chamber 18 is within the above-described range (50 μm or more and 70 μm or less).

[Diaphragm]

The diaphragm 14 in the head 404 as described below is deformed and displaced by receiving a force generated by the electromechanical transducer film 16, and the ink in the pressure chamber 18 is thus discharged.

To reliably discharge the liquid at a high frequency, the diaphragm 14 should have high rigidity together with the electromechanical transducer film 16, the first insulating protective film 21, and the second insulating protective film 22. The diaphragm 14 is preferably composed of a plurality of layers, such that the diaphragm 14 includes a plurality of layers formed of materials of $SiO_2$, SiN ($Si_3N_4$), or Poly-Si considering design stress. The film thickness of the diaphragm 14 is preferably from 1 μm to 3 μm, and the Young's modulus is preferably from 75 GPa to 95 GPa.

As a material of the diaphragm 14, Si, $SiO_2$, and $Si_3N_4$ are prepared according to a chemical vapor deposition (CVD) method, for example.

Further, as a material of the diaphragm 14, it is preferable to select a material close to a linear expansion coefficient of the first electrode 15 and the electromechanical transducer film 16. As a material of the electromechanical transducer film 16, lead zirconate titanate (PZT) is generally used. Thus, as a material of the diaphragm 14, a material having a linear expansion coefficient of $5 \times 10^{-6}$ to $10 \times 10^{-6}$ close to a linear expansion coefficient $8 \times 10^{-6}$ (1/K) is preferably used, and a material having a linear expansion coefficient of $7 \times 10^{-6}$ to $9 \times 10^{-6}$ is more preferably used.

Specific examples of the materials of the diaphragm 14 include aluminum oxide, zirconium oxide, iridium oxide, ruthenium oxide, tantalum oxide, hafnium oxide, osmium oxide, rhenium oxide, rhodium oxide, palladium oxide, and compounds of the foregoing materials. Using such materials, the diaphragm 14 can be produced by a spin coater using sputtering or a sol-gel method.

The film thickness of the diaphragm 14 is preferably from 1 μm to 3 μm as described above and is more preferably from 1.5 μm to 2.5 μm. As a result, it becomes easier to process the pressure chamber 18, and the diaphragm 14 becomes further easily deformed.

[Electrode]

Further, the first electrode 15 and the second electrode 17 (lower electrode and upper electrode) may be made of a metal film or an oxide electrode film. Particularly, the first electrode 15 and the second electrode 17 (lower electrode and upper electrode) may be composed of a laminated body of a metal film and an oxide electrode film.

Each of the first electrode 15 and the second electrode 17 (lower electrode and upper electrode) may have a metal layer having a sufficiently low electrical resistance. As the metal material of the metal layer, platinum having high heat resistance and low reactivity can be used. However, platinum may not have a sufficient barrier property against lead. Accordingly, platinum group elements, such as iridium and platinum-rhodium, or alloy films of the platinum group elements may be used for the first electrode 15 and the second electrode 17.

When platinum is used, adhesion of platinum with a base (in particular, $SiO_2$) is poor. Therefore, for example, Ti, $TiO_2$, Ta, $Ta_2O_5$, or $Ta_3N_5$ is preferably laminated in advance as an intervening layer. Examples of a method of producing the metal layer include a sputtering method and a vacuum vapor deposition method. The film thickness of each of the first electrode 15 and the second electrode 17 is preferably from 0.05 to 1 μm and is more preferably from 0.1 to 0.5 μm.

Further, the first electrode 15 and the second electrode 17 (lower electrode and upper electrode) may have a conductive oxide electrode layer at an interface with the electromechanical transducer film 16. As a material of the oxide electrode layer, for example, $SrRuO_3$ or $LaNiO_3$ can be used. The method for film-forming the oxide electrode layer (oxide electrode film) is not particularly limited. However, the oxide electrode layer may be formed by sputtering, for example.

The oxide electrode layer that constitutes the lower electrode also affects control of an orientation of the electromechanical transducer film 16 formed on the oxide electrode layer. Thus, different material is selected for the oxide electrode layer according to a direction of preferential orientation.

It is preferable to make the (100) plane to be the preferential orientation of the electromechanical transducer film 16 in the present embodiment. Thus, the electromechanical transducer film 16 may be formed after a seed layer made of $LaNiO_3$, $TiO_2$, or $PbTiO_3$ as the oxide electrode layer is produced on the first electrode 15. $SrRuO_3$ can be used as the oxide electrode layer that constitutes the upper electrode.

The film thickness of the oxide electrode layer is preferably in a range from 20 nm to 80 nm and is more preferably in a range from 30 nm to 50 nm. As a result, good characteristics can be obtained with respect to an initial deformation (surface displacement), an amount of deformation over time (surface displacement), and an amount of leakage of electric current.

The electromechanical transducer film 16 may be formed of an oxide containing Pb (for example, PZT). The PZT is a solid solution of lead zirconate ($PbZrO_3$) and titanium acid ($PbTiO_3$) and has different characteristics according to a ratio of the lead zirconate ($PbZrO_3$) and the titanium acid ($PbTiO_3$) in the solution. In a composition exhibiting generally superior piezoelectric properties, a ratio of $PbZrO_3$ and $PbTiO_3$ is 53:47. If the composition is represented by a chemical formula, the composition is represented by Pb($Zr_{0.53}$, $Ti_{0.47}$)$O_3$, generally, PZT (53/47).

In the present embodiment, it is preferable to use PZT as the electromechanical transducer film 16 and set the (100) plane of the PZT to a preferred orientation. In this case, the composition ratio of Zr/Ti, that is Ti/(Zr+Ti), is preferably 0.45 (45%) or more and 0.55 (55%) or less, and is more preferably 0.48 (48%) or more and 0.52 (52) or less.

The degree of crystal orientation ρ (hkl) of the (hkl) plane of the electromechanical transducer film 16 is:

$$\rho(hkl) = I(hkl)/\Sigma I(hkl)$$

Here, ρ (hkl) represents an orientation degree in (hkl) plane direction, I (hkl) represents a peak intensity in any orientation, and ΣI (hkl) represents a sum of peak intensities. When the sum of peak intensities of the (hkl) plane of the electromechanical transducer film 16 obtained by θ-2θ measurement using X-ray diffraction is assumed to be 1, the degree of orientation of (100) orientation calculated based on the ratio of the peak intensities of respective orientations is preferably 0.75 or more and is more preferably 0.85 or more.

When the degree of orientation of (100) orientation is 0.75 or more, sufficient piezoelectric strain can be obtained, and a sufficient amount of deformation can be reliably obtained.

The materials are represented by a general formula $ABO_3$ and composite oxides including A=Pb, Ba, and Sr, and B=Ti, Zr, Sn, Ni, Zn, Mg, and Nb as main components correspond to the materials.

Specific examples of the composite oxides include $(Pb_{1-x}, Ba_x)(Zr, Ti)O_3$ and $(Pb_{1-x}, Sr_x)(Zr, Ti)O_3$, in which a part of Pb at A site is replaced with Ba or Sr. The substitution of Pb to Ba or Sr is enabled by a bivalent element, and the substitution works to reduce deterioration of characteristics caused by an evaporation of lead during heat treatment.

As a method to produce the electromechanical transducer film 16, a spin coater or the like using a sputtering method or a sol-gel method may be used, for example. When sputtering or Sol-gel is used to produce the electromechanical transducer film 16, a desired pattern is obtained by photolithographic etching because patterning is necessary.

When PZT is prepared by the sol-gel method, lead acetate, zirconium alkoxide, and titanium alkoxide compounds are used as starting materials and are dissolved in methoxyethanol functioning as a common solvent and a uniform solution is obtained. Thus, a PZT precursor solution can be prepared. The metal alkoxide compound is easily hydrolyzed by moisture in the air. Thus, an appropriate amount of a stabilizer such as acetylacetone, acetic acid, diethanolamine or the like may be added as a stabilizer to the precursor solution.

To form the PZT film on a whole surface of diaphragm 14, a base substrate is coated with a film using a solution coating method such as spin coating, and the coating film is subjected to heat treatment such as solvent drying, thermal decomposition, and crystallization. When the coated film is transformed to the crystallized film, the volume of the film contracts. To obtain a crack-free film, the concentration of the precursor solution is preferably adjusted to obtain a film thickness not greater than 100 nm in a one-time process. The PZT film is thus produced.

The thickness of the electromechanical transducer film 16 is preferably from 1.0 μm to 3.0 μm and is more preferably from 1.5 μm to 2.5 μm. Thereby, sufficient deformation can be obtained.

Figure 3A:
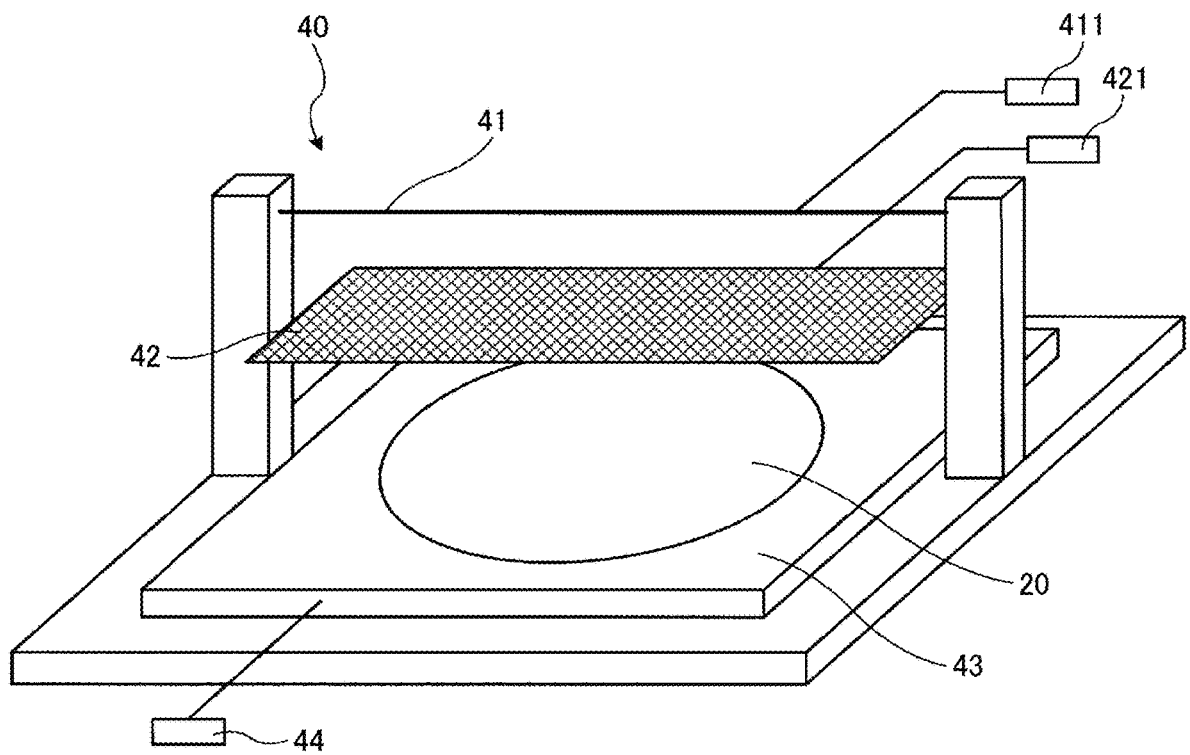
FIGS. 3A and 3B are a schematic perspective view and a cross-sectional view, respectively, of a configuration example of a polarization processing device used for producing the electromechanical transducer element according to the present disclosure.
Figure 3B:
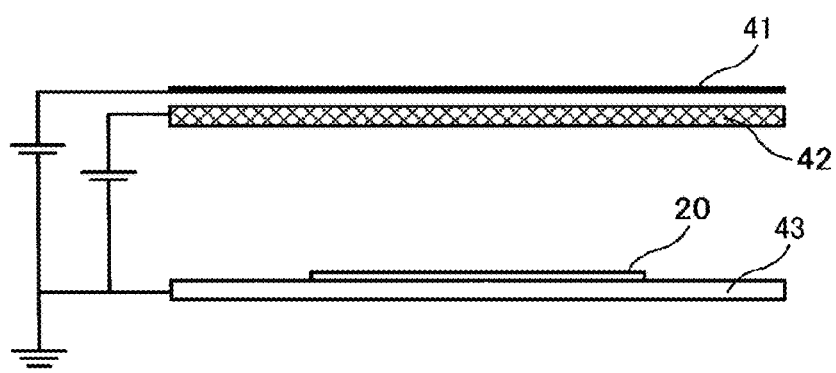

Next, a description is given of a method of performing polarization processing on an electromechanical transducer film 16 in a production process of the electromechanical transducer element 20 having the above-described configuration. FIG. 3A is a perspective view of a schematic configuration example of a polarization processing device 40 used to polarize an electromechanical transducer film 16 in a production process of the electromechanical transducer element 20 according to the present disclosure. FIG. 3B is a side view of the polarization processing device 40 in FIG. 3A.

As illustrated in FIGS. 3A and 3B, the polarization processing device 40 includes a corona electrode 41, a grid electrode 42, and a stage 43 having a counter electrode.

Further, the stage 43 may include a temperature controller to heat the electromechanical transducer element 20. The heating temperature at the time of polarization processing is not particularly limited but the stage 43 may be configured to be able to heat the electromechanical transducer element 20 to 350° C. as a maximum temperature. Further, an earth wire 44 is connected to the stage 43 on which a sample is placed so that the charge can easily flow to the sample (the electromechanical transducer element 20) to be subjected to the discharge treatment.

The corona electrode 41 and the grid electrode 42 are connected to a corona-electrode power supply 411 and a grid-electrode power supply 421, respectively. The corona electrode 41 may have, for example, a wire shape.

The grid electrode 42 is a mesh configured so that, when a high voltage is applied to the corona electrode 41, ion, electric charge, and so on generated by corona discharge effectively fall onto a sample stage.

The magnitude of the voltage applied to each of the corona electrode 41 and the grid electrode 42 and the distance between the sample and each electrode are not particularly limited. For example, to sufficiently polarize the sample, the magnitude of the voltage applied to each of the corona electrode 41 and the grid electrode 42 and the distance between the sample and each electrode may be adjusted in accordance with the sample to adjust the intensity of the corona discharge.

Figure 4:
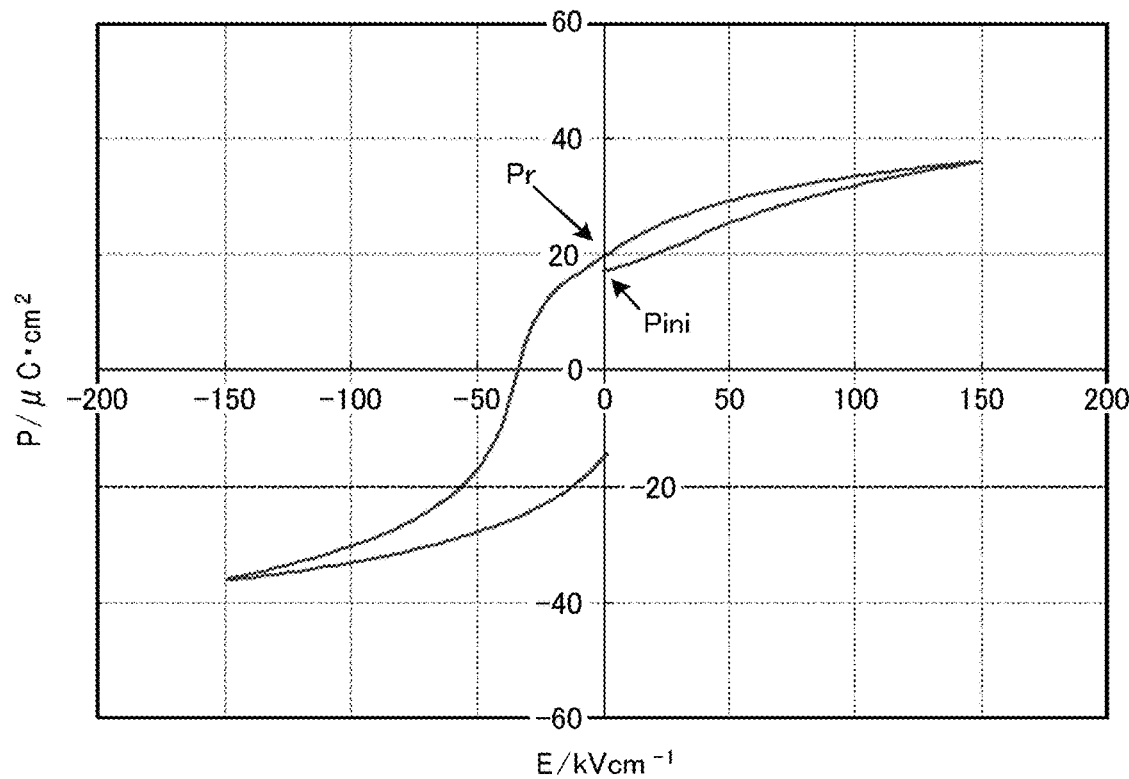
FIG. 4 is a graph illustrating a P-E hysteresis loop after polarization.

A state of the polarization processing can be determined from a P-E hysteresis loop. FIG. 4 is a graph illustrating a P-E hysteresis loop after polarization. As illustrated in FIG. 4, the hysteresis loop is measured while an intensity of electric field of 150 kV/cm is applied to the corona electrode 41 and the grid electrode 42. Pini represents an initial polarization amount when the intensity of electric field is 0 kV/cm. Pr represents a polarization amount at 0 kV/cm when the intensity of electric field is returned to 0 kV/cm after a voltage of +150 kV/cm is applied to the electromechanical transducer element 20.

Here, the value of Pr-Pini is defined as "polarization rate". It can be determined that a state of polarization increases as the polarization rate declines.

Performing the polarization process increases Pini as illustrated in FIG. 4, and as the polarization process proceeds, a value of a difference of the polarization amount Pr-Pini decreases.

The polarization rate is preferably 10 μC/cm$^2$ or less, and more preferably 5 μC/cm$^2$ or less. When the polarization rate satisfies the above-described conditions, it can be said that the polarization process is sufficiently performed.

A desirable polarization ratio Pr-Pini can be obtained by adjusting voltages of the corona electrode 41 and the grid electrode 42, a distance between the stage 43 and each of the corona electrode 41 and the grid electrode 42, or the like in the polarization processing device 40 illustrated in FIGS. 3A and 3B.

As described above, the electromechanical transducer element 20 according to the present disclosure includes the electromechanical transducer film 16, a pair of electrodes (first electrode 15 and second electrode 17), and the insulating protective film (first insulating protective film 21 and second insulating protective film 22).

The electromechanical transducer element 20 is made of complex oxide having a perovskite structure containing at least Pb, Zr and Ti. The pair of electrodes (first electrode 15 and second electrode 17) sandwiches the electromechanical transducer element 20.

The insulating protective film (first insulating protective film 21 and second insulating protective film 22) covers the electromechanical transducer film 16 and the pair of electrodes (first electrode 15 and second electrode 17).

The electromechanical transducer element 20 has to maintain electromechanical transducer characteristic even in a high humidity environment and to continue driving without failure. Thus, it is necessary to keep an amount of leak current to a predetermined amount or less to suppress an occurrence of dielectric breakdown.

In controlling the amount of leak current in the electromechanical transducer element 20, it is most important to control the amount of leak current of the electromechanical transducer film 16 itself flowing in the electromechanical transducer film 16. To control the amount of leak current of the electromechanical transducer film 16, it is effective to adjust an amount of excess Pb that may become a leak source. Particularly in a high humidity environment, it is also important to control an amount of current flowing outside the electromechanical transducer film 16 to prevent a short circuit between the pair of electrodes (the first electrode 15 and the second electrode 17).

To solve the above-described problems, the electromechanical transducer film 16 of the electromechanical transducer element 20 according to the present disclosure has a substantially uniform Pb content in a film thickness direction of the electromechanical transducer film 16. In an environment in which a water vapor pressure (also referred to as water vapor partial pressure) is 300 kPa, a density of leak current measured between terminals electrically connected to the pair of electrodes (the first electrode 15 and the second electrode 17) is $4.2 \times 10^{-6}$ A/cm$^2$ or less. Thus, the electromechanical transducer element 20 can maintain electromechanical transducer characteristic even in a high humidity environment and continue driving without failure.

In the present disclosure, the meaning of "the Pb content is substantially uniform in the film thickness direction" in the electromechanical transducer film 16 is that the Pb content measured in the film thickness direction is within ±4% of the average value, meaning that a difference between the measured values is within a range of 8%.

Here, "Pb content" is the ratio of Pb to a total amount of other components measured by composition analysis. In the case of a PZT film, "Pb content ratio" is a ratio (atomic number ratio) of Pb content to a sum of contents of Zr and Ti.

Specifically, the amounts of Pb, Zr, and Ti measured at arbitrary positions of the electromechanical transducer film 16 are values calculated by Pb amount/(Zr amount+Ti amount).

The average Pb content of the electromechanical transducer film 16 is preferably from 100% to 110% with respect to the sum of the contents of Zr and Ti. When the amount of Pb in the electromechanical transducer film 16 is in the above range, the leak current can be sufficiently reduced.

Here, the "average Pb content" is a value calculated by an average "Pb amount/(average Zr amount+average Ti amount)" for the amounts of Pb, Zr and Ti obtained at a plurality of measurement points of the electromechanical transducer film 16.

The electromechanical transducer film 16 preferably has a plurality of particles and crystal grain boundaries between the plurality of particles. Further, a Pb content of an area including a crystal grain boundary is preferably 105% or less of a Pb content inside the plurality of particles. That is, the Pb content of crystal particles is preferably at the same level as the Pb content of non-crystal particles.

Further, a Pb content of an area including the crystal grain boundary may be less than 105% of a Pb content inside the plurality of particles.

The average Pb content is analyzed by Inductively Coupled Plasma (ICP) emission analysis, for example, to perform a compositional analysis of PZT. A Transmission Electron Microscopy-Energy Dispersive X-ray Spectroscopy (TEM-EDS) may be used to analyze the Pb content of the crystal particles and the Pb content of the crystal grain boundaries.

Here, "La" represents a value of the density of leak current measured between the terminals electrically connected to the pair of electrodes (the first electrode 15 and the second electrode 17) in the electromechanical transducer element 20 according to the present disclosure. Further, "Lb" represents a value of the density of bulk-leak current flowing in the electromechanical transducer film 16. Then, the density of leak current La and the density of bulk-leak current Lb preferably satisfies the relationship of Lb/La≥0.30.

That is, the electromechanical transducer element 20 according to the present disclosure preferably has a sufficiently small non-bulk-leak current and preferably has a structure or a layout that does not permit the leak current.

For example, in the configuration as illustrated in FIG. 2, the bulk-leak current flowing in the electromechanical transducer film 16 can be measured by digitizing the leak current flowing in the bulk while changing a peripheral length of the electrode in a state in which an electrode area is substantially same between the third electrode 27 and the fourth electrode 28.

Further, the electric current of the electromechanical transducer element 20 is distinguished from the electric current of other parts from sheet resistance values of the second electrode 17, the third electrode 27, the fourth electrode 28, and the second insulating protective film 22 to measure the bulk-leak current flowing in the electromechanical transducer film 16.

The electromechanical transducer element 20 according to the present disclosure preferably has a dielectric strength of 100V or more.

The above-described dielectric strength of 100V or more enables the electromechanical transducer element 20 to maintain the electromechanical transducer characteristics and continual driving without failure, thus achieving high reliability.

The dielectric strength of the electromechanical transducer element 20 can be evaluated by measuring the leak current when a voltage is applied in 1V steps, for example, from 0 to 200V as Time Zero Dielectric Breakdown (TZDB) evaluation. TZDB evaluation is also referred to as an instantaneous breakdown evaluation.

A failure occurrence rate of the electromechanical transducer element 20 can be evaluated by calculating a failure occurrence rate when the electromechanical transducer element 20 is driven at a predetermined voltage (for example, DC voltage of 50V) for a predetermined time (for example, $1 \times 10^6$ seconds) as a Time Dependency Dielectric Breakdown (TDDB) evaluation. The TDDB evaluation is also referred to as an evaluation of dielectric breakdown over time.

Figure 5:
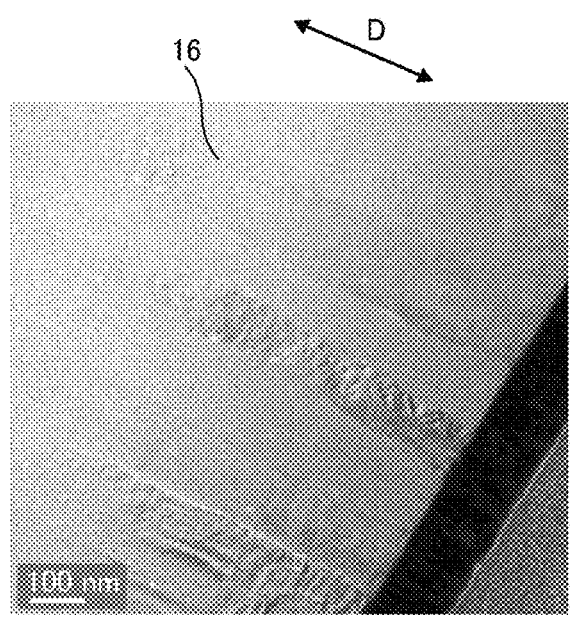
FIG. 5 is a cross-sectional TEM image of an electromechanical transducer film of the electromechanical transducer element according to the present disclosure.

The electromechanical transducer film 16 is a crystal film preferentially oriented to the (100) plane, and the crystal particles of the electromechanical transducer film 16 are preferably columnar crystal particles grown in the film thickness direction. FIG. 5 illustrates a cross-sectional Transmission Electron Microscope (TEM) image of an example of the electromechanical transducer film 16 according to the present embodiment.

In FIG. 5, a lower right portion is an electrode, and columnar crystal particles grown in the film thickness direction as indicated by arrow "D" can be observed in the electromechanical transducer film 16.

[Liquid Discharge Head]

Figure 12:
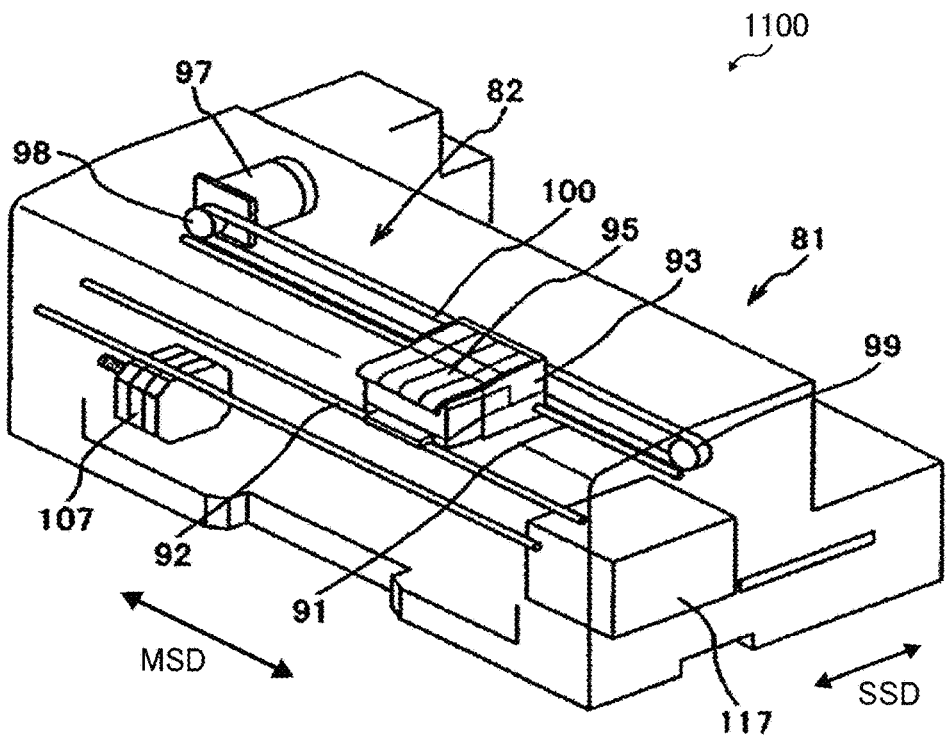
FIG. 12 is a schematic perspective view of another example of a liquid discharge apparatus.
Figure 13:
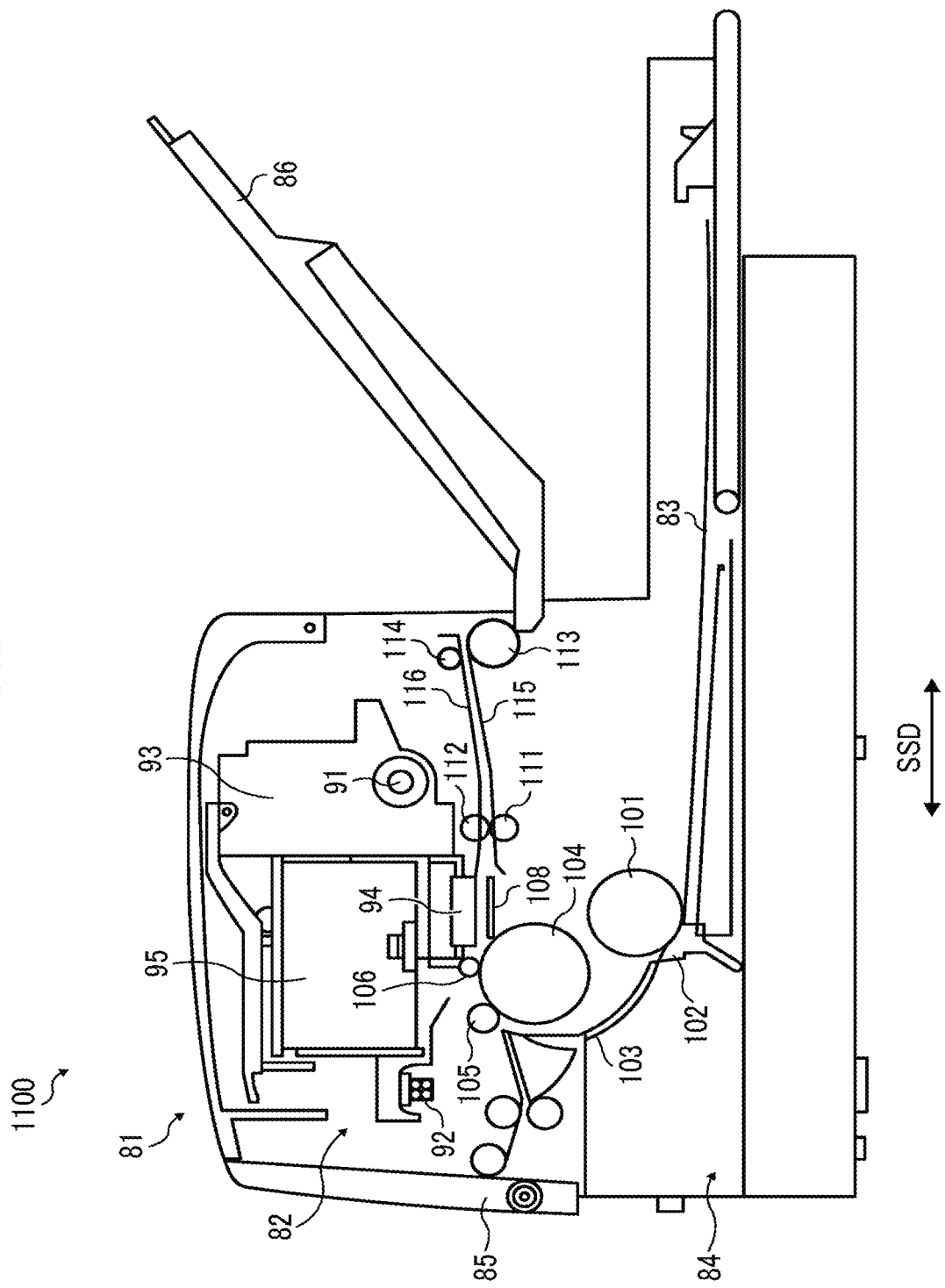
FIG. 13 is a schematic cross-sectional view of another example of a liquid discharge apparatus.

FIGS. 6A and 6B are cross-sectional views of an embodiment of the head 404 (liquid discharge head) used in an inkjet recording apparatus as a liquid discharge apparatus 1000 (see FIGS. 8 and 9) and image forming apparatus 1100 (see FIGS. 12 and 13). The electromechanical transducer element 20 according to the present embodiment is applied to the head 404.

As illustrated in FIGS. 6A and 6B, the head 404 used in the liquid discharge apparatus 1000 includes a nozzle plate 12, pressure chamber 18, and the electromechanical transducer element 20. A nozzle 11 is formed in the nozzle plate 12, and a liquid (ink) for image formation is discharged from the nozzle 11. The pressure chamber 18 is communicated with the nozzle 11. The electromechanical transducer element 20 is a pressure generator to generate pressure to discharge ink in the pressure chamber 18 from the nozzle 11.

When a predetermined voltage is applied to the electromechanical transducer element 20, the electromechanical transducer element 20 deforms to displace a surface of the diaphragm 14 toward the pressure chamber 18, thus generating pressure on the liquid in the pressure chamber 18. The pressure allows liquid (ink droplets) to be discharged from the nozzle 11 communicated with the pressure chamber 18.

To produce the head 404, for example, the first electrode 15, the electromechanical transducer film 16, and the second electrode 17 are etched to a desired shape to the electromechanical transducer element 20 as illustrated in FIG. 1. Then, the first insulating protective film 21 and the second insulating protective film 22 are formed to cover the first electrode 15, the electromechanical transducer film 16, and the second electrode 17. Then, the pressure chamber 18 is formed by etching the substrate 13 from the substrate 13 side (opposite to the electromechanical transducer film 16 side across the diaphragm 14 in FIG. 6A) to produce the head 404. The pressure chamber 18 accommodates the liquid (ink) to be discharged from the nozzle 11.

The first electrode 15 (lower electrode) is a common electrode and the second electrode 17 (upper electrode) is an individual electrode in FIG. 6A. Conversely, the first electrode 15 (lower electrode) is an individual electrode and the second electrode 17 (upper electrode) is a common electrode in FIG. 6B.

Further, a plurality of heads 404 may be arranged as in the example illustrated in FIGS. 7A and 7B.

FIG. 7A illustrates an example in which a plurality of heads 404 as illustrated in FIG. 6A are arrayed. Similarly to FIGS. 1 and 2, the first electrode 15 (lower electrode) is a common electrode, and the second electrode 17 (upper electrode) is an individual electrode. FIG. 7B illustrates an example in which a plurality of heads 404 as illustrated in FIG. 6B are arrayed. In FIG. 7B, the first electrode 15 (lower electrode) is an individual electrode, and the second electrode 17 (upper electrode) is a common electrode.

[Liquid Discharge Device and Liquid Discharge Apparatus]

The liquid discharge device of the present embodiment includes the head 404 of the present embodiment.

Further, the liquid discharge device of the present embodiment includes liquid discharge head 404 and at least one of: a head tank that stores liquid to be supplied to the liquid discharge head; a carriage on which the liquid discharge head is mounted; a supply mechanism that supplies liquid to the liquid discharge head; a maintenance mechanism that maintains the liquid discharge head; and a main scanning moving mechanism to move the liquid discharge head in the main scanning direction to form a single unit.

The liquid discharge apparatus of the present embodiment includes the head 404 of the present embodiment or the liquid discharge device of the present embodiment.

Figure 8:
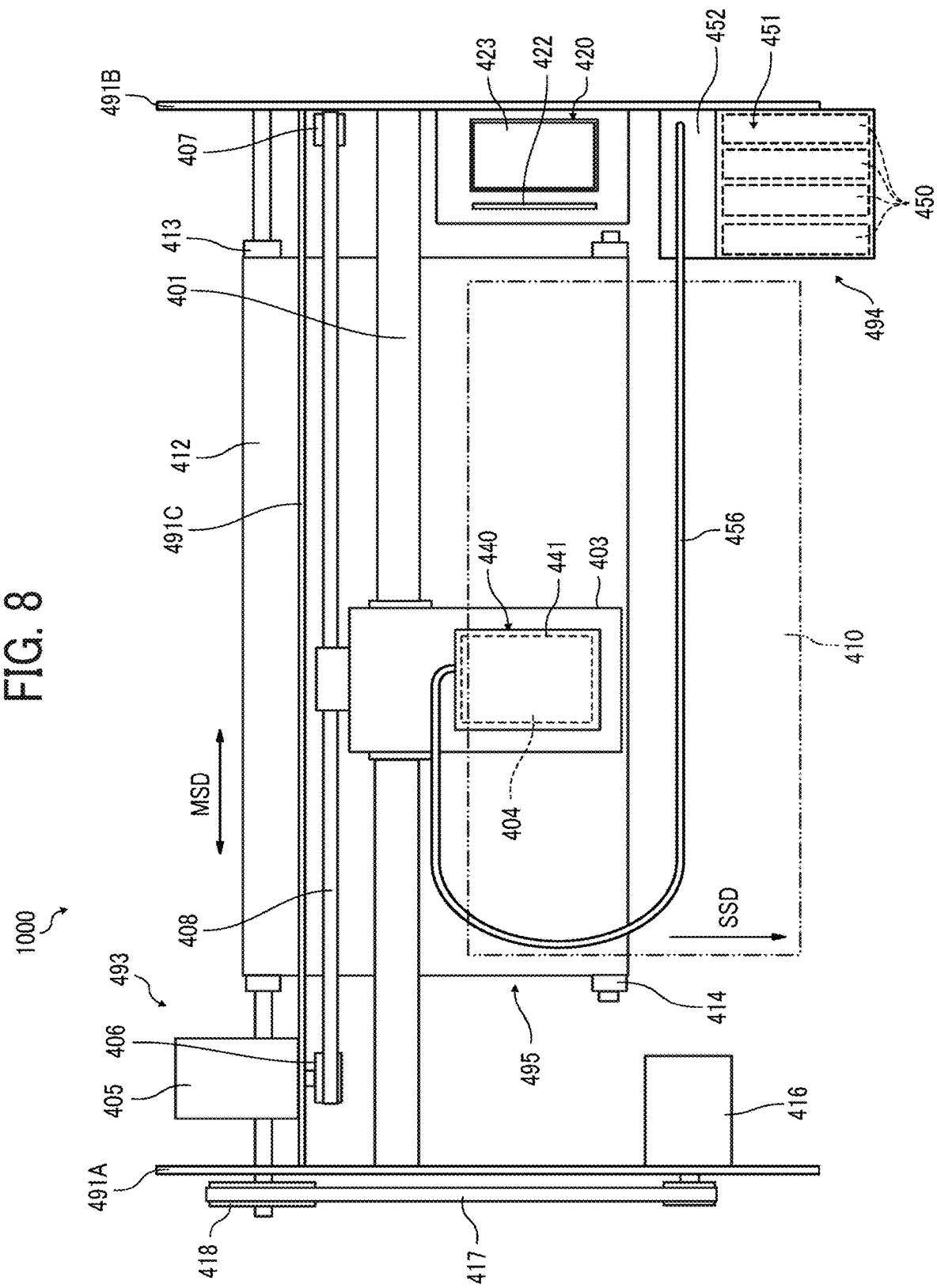
FIG. 8 is a schematic plan view of an example of a liquid discharge apparatus according to the present disclosure.
Figure 9:
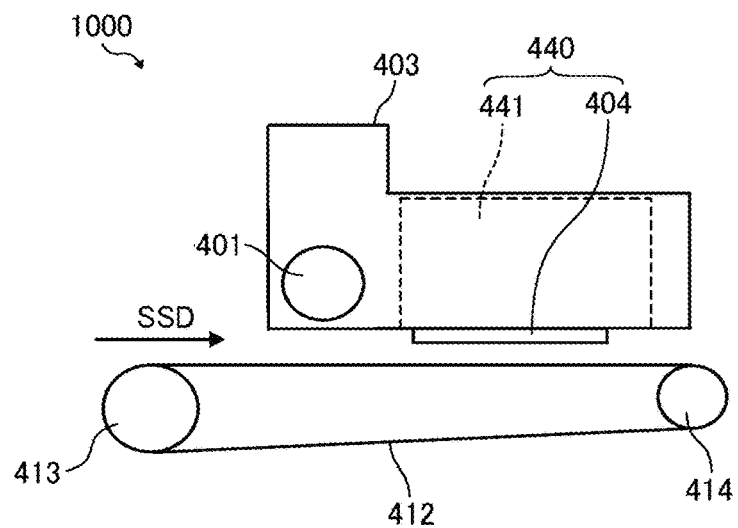
FIG. 9 is a schematic side view of the example of the liquid discharge apparatus according to the present disclosure.

Next, an example of the liquid discharge apparatus 1000 according to the present disclosure is described with reference to FIGS. 8 and 9. FIG. 8 is a plan view of a portion of the liquid discharge apparatus 1000. FIG. 9 is a side view of a portion of the liquid discharge apparatus 1000 of FIG. 8.

The liquid discharge apparatus 1000 is a serial type apparatus, and the carriage 403 reciprocally moves in the main scanning direction as indicated by arrow MSD by the main scan moving unit 493. The main scan moving unit 493 includes a guide 401, a main scanning motor 405, a timing belt 408, and the like. The main scan moving unit 493 functions as a drive device to move the carriage in the main scanning direction MSD. The guide 401 is bridged between the left-side plate 491A and right-side plate 491B to moveably hold the carriage 403. The main scanning motor 405 reciprocally moves the carriage 403 in the main scanning direction MSD via the timing belt 408 bridged between a driving pulley 406 and a driven pulley 407.

The carriage 403 mounts a liquid discharge device 440. The head 404 according to the present disclosure and a head tank 441 forms the liquid discharge device 440 as a single unit. The head 404 of the liquid discharge device 440 discharges liquid of each color, for example, yellow (Y), cyan (C), magenta (M), and black (K). The head 404 includes a nozzle array including a plurality of nozzles arrayed in row in a sub-scanning direction perpendicular to the main scanning direction. The head 404 is mounted to the carriage 403 so that ink droplets are discharged downward.

The liquid stored in liquid cartridges 450 are supplied to the head tank 441 by a supply device 494 to supply the liquid stored outside the head 404 to the head 404.

The supply device 494 includes a cartridge holder 451 which is a filling section for mounting the liquid cartridges 450, a tube 456, a liquid feed unit 452 including a liquid feed pump, and the like. The liquid cartridges 450 are detachably mounted to the cartridge holder 451. The liquid is fed from the liquid cartridge 450 to the head tank 441 by the liquid feed unit 452 via the tube 456.

The liquid discharge apparatus 1000 includes a conveyance unit 495 to convey a sheet 410. The conveyance unit 495 includes a conveyance belt 412 as a conveyance unit and a sub-scanning motor 416 to drive the conveyance belt 412.

The conveyance belt 412 attracts the sheet 410 and conveys the sheet 410 at a position facing the head 404. The conveyance belt 412 is an endless belt and is stretched between a conveyance roller 413 and a tension roller 414. Attraction of the sheet 410 to the conveyance belt 412 may be applied by electrostatic adsorption, air suction, or the like.

The conveyance belt 412 rotates in the sub-scanning direction as indicated by arrow SSD as the conveyance roller 413 is rotationally driven by the sub-scanning motor 416 via the timing belt 417 and the timing pulley 418.

At one side in the main scanning direction MSD of the carriage 403, a maintenance device 420 to maintain the head 404 in good condition is disposed on a lateral side of the conveyance belt 412.

The maintenance device 420 includes, for example, a cap 423 to cap a nozzle face of the head 404 and a wiper 422 to wipe the nozzle face. The nozzle face is a surface of the head 404 on which the nozzles are formed.

The main scan moving unit 493, the supply device 494, the maintenance device 420, and the conveyance unit 495 are mounted to a housing that includes a left-side plate 491A, a right-side plate 491B, and a rear-side plate 491C.

In the liquid discharge apparatus 1000 thus configured, the sheet 410 is conveyed on and attracted to the conveyance belt 412 and is conveyed in the sub-scanning direction SSD by the cyclic rotation of the conveyance belt 412.

The head 404 is driven in response to image signals while the carriage 403 moves in the main scanning direction MSD, to discharge liquid to the sheet 410 stopped, thus forming an image on the sheet 410.

As described above, the liquid discharge apparatus 1000 includes the head 404 according to the present disclosure, thus allowing stable formation of high-quality images.

Figure 10:
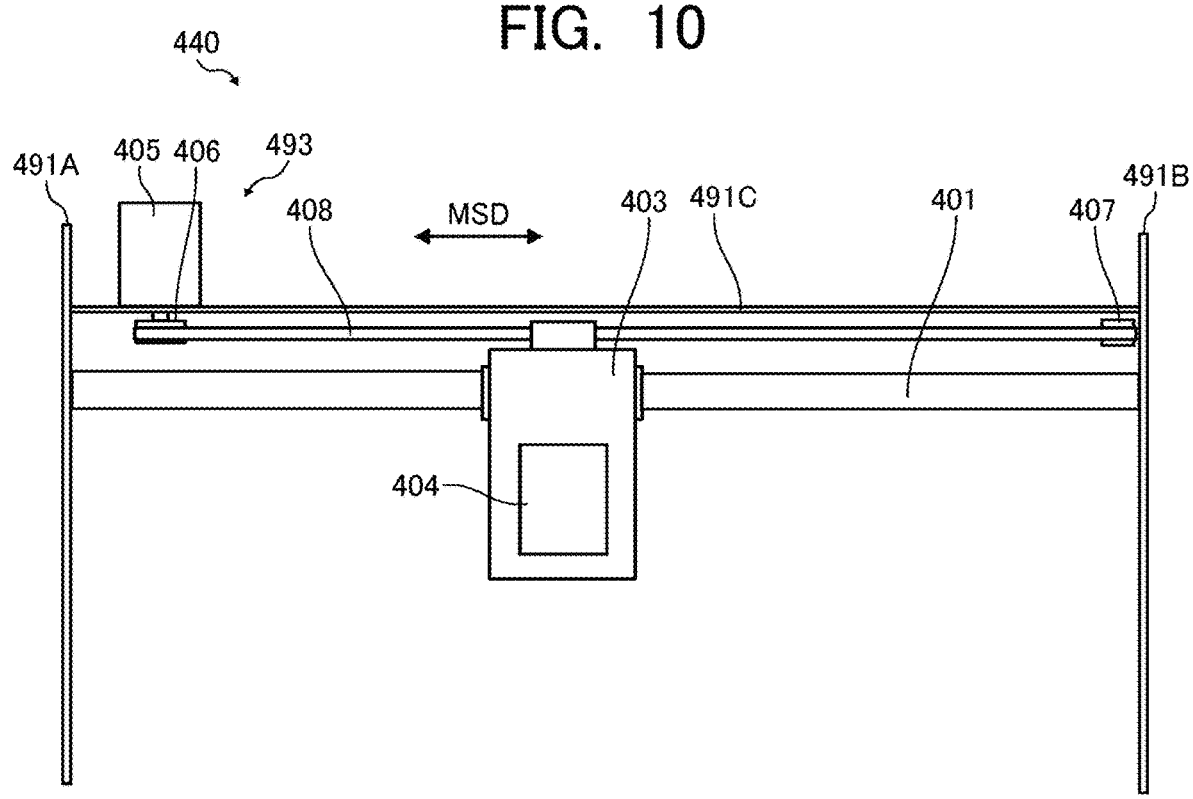
FIG. 10 is a schematic plan view of an example of the liquid discharge device according to the present disclosure.

Next, the liquid discharge device 440 according to another embodiment of the present disclosure is described with reference to FIG. 10. FIG. 10 is a plan view of a portion of another example of the liquid discharge device 440.

The liquid discharge device 440 includes a housing, the main scan moving unit 493, the carriage 403, and the head 404 among components of the liquid discharge apparatus 1000. The left-side plate 491A, the right-side plate 491B, and the rear-side plate 491C constitute the housing.

The liquid discharge device 440 may be configured to further attach at least one of the above-described maintenance device 420 and the supply device 494 to, for example, the right-side plate 491B of the liquid discharge device 440.

Figure 11:
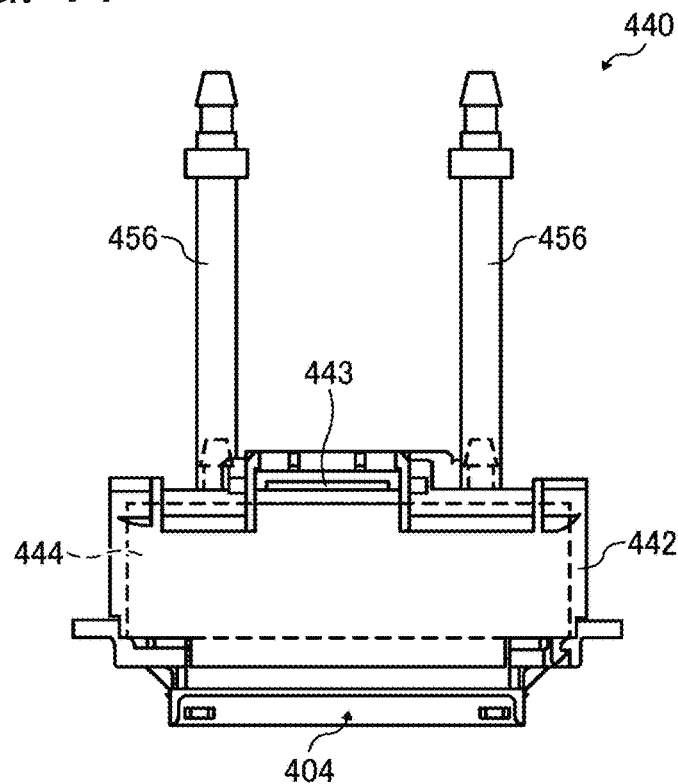
FIG. 11 is a schematic cross-sectional view of another example of the liquid discharge device according to the present disclosure.

Next, still another example of the liquid discharge device according 440 to the present disclosure is described with reference to FIG. 11. FIG. 11 is a front view of still another example of the liquid discharge device 440.

The liquid discharge device 440 includes the head 404 to which a channel part 444 is mounted and a tube 456 connected to the channel part 444.

Further, the channel part 444 is disposed inside a cover 442. Instead of the channel part 444, the liquid discharge device 440 may include the head tank 441. A connector 443 electrically connected with the head 404 is provided on an upper part of the channel part 444.

In the above-described embodiments, the "liquid discharge apparatus" includes the liquid discharge head or the liquid discharge device and drives the liquid discharge head to discharge liquid. The liquid discharge apparatus may be, for example, an apparatus capable of discharging liquid to a material to which liquid can adhere and an apparatus to discharge liquid toward gas or into liquid.

The "liquid discharge apparatus" may include devices to feed, convey, and eject the material on which liquid can adhere. The liquid discharge apparatus may further include a pretreatment apparatus to coat a treatment liquid onto the material, and a post-treatment apparatus to coat a treatment liquid onto the material, onto which the liquid has been discharged.

The "liquid discharge apparatus" may be, for example, an image forming apparatus to form an image on a sheet by discharging ink, or a three-dimensional fabrication apparatus to discharge a fabrication liquid to a powder layer in which powder material is formed in layers to form a three-dimensional fabrication object.

The "liquid discharge apparatus" is not limited to an apparatus to discharge liquid to visualize meaningful images, such as letters or figures. For example, the liquid discharge apparatus may be an apparatus to form arbitrary images, such as arbitrary patterns, or fabricate three-dimensional images.

The above-described term "material on which liquid can be adhered" represents a material on which liquid is at least temporarily adhered, a material on which liquid is adhered and fixed, or a material into which liquid is adhered to permeate. Examples of the "material on which liquid can be adhered" include recording media, such as paper sheet, recording paper, recording sheet of paper, film, and cloth, electronic part, such as electronic substrate and piezoelectric element, and media, such as powder layer, organ model, and testing cell. The "material on which liquid can be adhered" includes any material on which liquid is adhered, unless particularly limited.

Examples of the "material on which liquid can be adhered" include any materials on which liquid can be adhered even temporarily, such as paper, thread, fiber, fabric, leather, metal, plastic, glass, wood, ceramic, construction materials (e.g., wall paper or floor material), and cloth textile.

Examples of the "liquid" are, e.g., ink, treatment liquid, DNA sample, resist, pattern material, binder, fabrication liquid, or solution and dispersion liquid including amino acid, protein, or calcium.

The "liquid discharge apparatus" may be an apparatus to relatively move the head and a material on which liquid can be adhered. However, the liquid discharge apparatus is not limited to such an apparatus. For example, the liquid discharge apparatus may be a serial head apparatus that moves the head or a line head apparatus that does not move the head.

Examples of the "liquid discharge apparatus" further include a treatment liquid coating apparatus to discharge a treatment liquid to a sheet surface to coat the sheet with the treatment liquid to reform the sheet surface and an injection granulation apparatus to discharge a composition liquid including a raw material dispersed in a solution from a nozzle to mold particles of the raw material.

The "liquid discharge device" is an assembly of parts relating to liquid discharge. The term "liquid discharge device" represents a structure including the head and a functional part(s) or unit(s) combined to the head to form a single unit. For example, the "liquid discharge device" includes a combination of the head with at least one of a head tank, a carriage, a supply device, a maintenance device, and a main scan moving unit.

Examples of the "single unit" include a combination in which the head and one or more functional parts and units are secured to each other through, e.g., fastening, bonding, or engaging, and a combination in which one of the head and the functional parts and units is movably held by another. The head 404 may be detachably attached to the functional part(s) or unit(s) s each other.

For example, as a liquid discharge device, there is a liquid discharge device in which the head 404 and the head tank 441 form a single unit, as in the liquid discharge device 440 illustrated in FIG. 9. Alternatively, the head 404 and the head tank 441 coupled (connected) with a tube or the like may form the liquid discharge device as a single unit. Here, a unit including a filter may further be added to a part between the head tank 441 and the head 404.

In another example, the liquid discharge device may include the head 404 and the carriage 403 to form a single unit.

In still another example, the liquid discharge device includes the head 404 movably held by the guide 401 that forms part of a main scan moving unit 493, so that the head 404 and the main scan moving unit 493 form a single unit. Like the liquid discharge device 440 illustrated in FIG. 10, the head 404, the carriage 403, and the main scan moving unit 493 may form the liquid discharge device 440 as a single unit.

In still another example, a cap that forms part of the maintenance device 420 is secured to the carriage 403 mounting the head 404 so that the head 404, the carriage 403, and the maintenance device 420 form a single unit to form the liquid discharge device 440.

Like the liquid discharge device 440 illustrated in FIG. 11, the tube 456 is connected to the head 404 mounting the head tank 441 or the channel part 444 so that the head 404 and the supply device 494 form a single unit as the liquid discharge device 440.

The main scan moving unit 493 may be a guide only. The supply device 494 may be a tube(s) only or a loading unit only.

The pressure generator used in the "liquid discharge head" is not limited to a particular-type of pressure generator. The pressure generator is not limited to the piezoelectric actuator (or a layered-type piezoelectric element) described in the above-described embodiments, and may be, for example, a thermal actuator that employs a thermoelectric transducer element, such as a thermal resistor or an electrostatic actuator including a diaphragm and opposed electrodes.

The terms "image formation", "recording", "printing", "image printing", and "fabricating" used herein may be used synonymously with each other.

A liquid discharge apparatus, such as the liquid discharge apparatus 1000, includes the head 404 as described above to discharge liquid from the nozzles in accordance with drive signals. The head 404 includes the electromechanical transducer element 20 as described above.

FIGS. 12 and 13 illustrate an image forming apparatus 1100 as one such liquid discharge apparatus 1000 according to the present disclosure. FIG. 12 is a perspective view of the image forming apparatus 1100 (liquid discharge apparatus. FIG. 13 is a side view of the image forming apparatus 1100.

The image forming apparatus 1100 (liquid discharge apparatus) according to the present embodiment accommodates a print mechanism 82 inside the liquid discharge apparatus 1000. The print mechanism 82 includes a carriage 93 movable inside an apparatus body 81 in the main scanning direction as indicated by arrow MSD, a liquid discharge head 94 mounted on the carriage 93, and ink cartridge to supply ink to the liquid discharge head 94, for example. Hereinafter, the liquid discharge head 94 is simply referred to as the "head 94".

The image forming apparatus 1100 further includes a sheet feeding cassette 84 (sheet tray) to stack a large number of sheets 83 as recording media. The sheet feeding cassette 84 is attached to a lower portion of the apparatus body 81 in such a manner that the sheet feeding cassette 84 can be detachably attachable to a front side of the apparatus body 81.

Further, the image forming apparatus 1100 includes a manual feed tray 85 to manually feed the sheets 83. Then, after the sheet 83 fed from the sheet feeding cassette 84 or the manual feed tray 85 is taken in and a required image is recorded by the print mechanism 82, the sheet 83 is discharged to the sheet ejection tray 86 mounted on a rear side of the image forming apparatus 1100. The print mechanism 82 includes a main guide rod 91 and a sub-guide rod 92 as guides laterally bridged between left and right-side plates.

The main guide rod 91 and the sub-guide rod 92 slidably support the carriage 93 in the main scanning direction MSD.

The carriage 93 mounts four heads 94 according to the present disclosure to discharge ink droplets of yellow (Y), cyan (C), magenta (M), and black (BK) inks, respectively. The heads 94 include multiple nozzle arrays in each of which a plurality of nozzles 11 are arrayed in a direction intersecting with the main scanning direction MSD. The nozzles 11 of the heads 94 are directed downward so that the ink droplets are discharged downward from the nozzles 11. Further, the carriage 93 detachably mounts the ink cartridges 95 that supplies ink of the respective colors (Y, C, M, K) to the heads 94.

Each of the ink cartridges 95 includes an air communication port communicated with the atmosphere in an upper portion of each ink cartridges 95, an ink supply port in a lower portion of each ink cartridges 95 to supply ink to the head 94, and a porous body to be filled with ink inside each ink cartridge 95. The capillary force of the porous body maintains the ink supplied to the head 94 at a slight negative pressure. Although the heads 94 of each color are used in FIG. 12 as the liquid discharge head, the head 94 may be a single head having plurality of arrays of nozzles discharging ink droplets of each color.

Here, the carriage 93 is slidably fitted on the main guide rod 91 on the rear side (downstream side in a sub-scanning direction indicated by arrow SSD in FIG. 12) of the image forming apparatus 1100. The carriage 93 is slidably mounted on the sub-guide rod 92 on the front side (upstream side in the sub-scanning direction SSD) of the image forming apparatus 1100.

To move and scan the carriage 93 in the main scanning direction MSD, a timing belt 100 is stretched between a driving pulley 98 rotated by a main scanning motor 97 and a driven pulley 99. The timing belt 100 is secured to the carriage 93. The carriage 93 is reciprocally moved by forward and reverse rotations of the main scanning motor 97.

To convey the sheets 83 set on the sheet feeding cassette 84 to an area below the heads 94, the image forming apparatus 1100 includes a sheet feed roller 101, a friction pad 102, a sheet guide 103, conveyance rollers 104 and 105, and a leading end roller 106. The sheet feed roller 101 and the friction pad 102 separates and feeds the sheets 83 from the sheet feeding cassette 84. The sheet guide 103 guides the sheets 83.

The conveyance rollers 104 and 105 reverses and conveys the sheet 83 fed from the sheet feed roller 101 to the leading end roller 106. The leading end roller 106 defines a feed angle of the sheet 83 from a nip portion between the conveyance roller 104 and the conveyance roller 105 pressed to the peripheral face of the conveyance roller 104. The conveyance roller 104 is rotationally driven by a sub-scanning motor 107 via a gear train.

The image forming apparatus 1100 further includes a print receiver 108 disposed below the head 94 as illustrated in FIG. 13. The print receiver 108 is a sheet guide to guide the sheet 83, which is fed from the conveyance roller 104, in a range corresponding to a range of movement of the carriage 93 in the main scanning direction MSD.

On the downstream side of the print receiver 108 in the sub-scanning direction SSD, the image forming apparatus 1100 includes a conveyance roller 111 and a spur 112 rotationally driven to feed the sheet 83 in the sub-scanning direction SSD. The image forming apparatus 1100 further includes a sheet ejection roller 113 and a spur roller 114 to feed the sheet 83 to the sheet ejection tray 86, and guides 115 and 116 constituting a sheet ejection passage.

In recording, the image forming apparatus 1100 drives the head 404 in response to image signals while moving (scanning) the carriage 93, discharges ink to the stopped sheet 83 to record one line of a desired image onto the sheet 83, and feeds the sheet 83 in a predetermined amount, and then records a next line on the sheet 83. When the image forming apparatus 1100 receives a signal indicating that a rear end of sheet 83 has reached a recording area or an end of recording operation, the image forming apparatus 1100 terminates a recording operation and ejects the sheet 83.

Further, the image forming apparatus 1100 includes a recovery device 117 to recover the head 94 to prevent a discharge failure of the head 94. The recovery device 117 is disposed at a position outside a recording area of the head 94 on a right end side in the moving direction of the carriage 93. The recovery device 117 includes a cap, a suction unit, and a cleaner. The recovery device 117 is equivalent to the maintenance device 420 of the liquid discharge apparatus 1000 in FIG. 8, and the cap and the cleaner of the recovery device 117 correspond to the cap 423 and wiper 422 of the maintenance device 420, respectively.

The carriage 93 is moved to the recovery device 117 side while waiting for printing. The head 94 is capped by the cap, and discharge failure due to ink drying can be prevented by keeping the nozzle 11 in a wet state. Further, the head 94 discharges the ink not related to the recording in the middle of the recording or the like to stabilize viscosity of ink in all the nozzles 11 to be constant and to maintain the stable discharge characteristics.

If a discharge failure occurs, for example, the nozzle 11 of the head 94 is sealed by the cap, and bubbles and the like are sucked from the nozzles 11 by the suction unit through a tube. Thus, the image forming apparatus 1100 can remove the ink and dust adhered on a surface of a nozzle plate 12 by the cleaner to recover the discharge failure of the head 94. The sucked ink is discharged to a waste ink container disposed on a lower portion of the apparatus body 81 and is absorbed into and held in an ink absorber in the waste ink container.

The image forming apparatus 1100 (liquid discharging apparatus) according to the present embodiment includes the head 404 that includes a highly reliable electromechanical transducer element 20 that can maintain the electromechanical transducer characteristic even in a high humidity environment and continuously drivable without failure. Thus, the head 404 has a stable ink discharge characteristics and can maintain high image quality.

Further, as a piezoelectric device including the electromechanical transducer element 20 according to the present disclosure may be also applied to a motor, an ultrasonic transducer, a piezoelectric sensor, a ferroelectric memory, a generator, a speaker, other than the above-described liquid discharge head and the liquid discharge apparatus (image forming apparatus).

EXAMPLES

More specific examples of the electromechanical transducer element (piezoelectric actuator) according to the present embodiment and the liquid discharge head including the electromechanical transducer element are described together with a comparative example.

Example 1

An example 1 is indicated as "EX1" in Table 1.

[Production of Electromechanical Transducer Element (Piezoelectric Actuator)]

First, a 6-inch silicon wafer as substrate 13 is prepared. $SiO_2$ (film thickness 600 nm), Si (film thickness 200 nm), $SiO_2$ (film thickness 100 nm), SiN (film thickness 150 nm), $SiO_2$ (film thickness 130 nm), SiN (film thickness 150 nm), $SiO_2$ (film thickness 100 nm), Si (film thickness 200 nm), and $SiO_2$ (film thickness 600 nm) are formed on the substrate 13 in the recited order to produce the diaphragm 14.

Then, the lower electrode (the first electrode 15 in the present embodiment) was formed on a portion to become the diaphragm 14. The lower electrode has a structure in which an adhesion layer and a metal electrode film are laminated. A titanium film (film thickness 20 nm) was film-formed at a film-forming temperature of 350° C. by a sputtering apparatus, and the film-formed titanium film was then thermally oxidized at 750° C. by a rapid thermal annealing (RTA) to form the adhesion layer. Subsequently, as a metal electrode film, a platinum film having a film thickness of 160 nm was formed at a film forming temperature of 400° C. by a sputtering apparatus.

Next, a Pb:Ti solution (hereinafter referred to as "PT solution") adjusted to have a composition ratio of Pb:Ti=1:1 was film-formed by spin coating method as a $PbTiO_3$ three-layer (hereinafter referred to as "PT layer") to become an underlayer. The PT solution is dried at 120° C. and a layer is formed to have a film thickness of 7 nm.

Next, PZT precursor solutions 1 to 3 adjusted to have following three composition ratios were prepared as an electromechanical transducer film. The PZT precursor solution 1, the PZT precursor solution 2, and the PZT precursor solution 3 were formed in the above-described order by a spin coating method.

[PZT precursor solution 1] Pb:Zr:Ti=115:58:42
[PZT precursor solution 2] Pb:Zr:Ti=115:53:47
[PZT precursor solution 3] Pb:Zr:Ti=110:48:52

For synthesis of a precursor coating liquid, lead acetate trihydrate, titanium isopropoxide, and zirconium isopropoxide were used as starting materials. Crystal water of lead acetate was dissolved in methoxyethanol and was then dehydrated. An amount of lead is excessively large to a stoichiometric composition. The above-described composition is to prevent a decrease in crystallinity due to so-called lead loss during heat treatment.

The titanium isopropoxide and the zirconium isopropoxide were dissolved in methoxyethanol, and an alcohol exchange reaction and an esterification reaction were advanced. A resultant was mixed with a methoxyethanol solution having dissolved the lead acetate to synthesize the PZT precursor solution.

At the time of synthesizing the PZT precursor solution, the PZT concentration in the PZT precursor solution was 0.5 mol/L. The PT solution was also prepared similarly to the PZT precursor solution.

Next, a PT layer was film-formed by spin coating using a PT solution and was dried at 120° C. after the film-formation of the PT layer. Then, a PZT precursor solution was film-formed by spin coating and was dried at 120° C. Further, a thermal decomposition at 400° C. were performed after the film-formation and drying of the PZT precursor solution. The above-described processes of film-forming, drying, and thermal decomposition were repeated to form a laminated film.

After thermal decomposition treatment on the third layer was finished, crystallization heat treatment (at 700° C. for 10 minutes) was performed by the rapid thermal anneal RTA). At this time, the film thickness of PZT was 240 nm.

The above-described process was performed a total of eight times, and a total of 24 layers were laminated to obtain an electromechanical transducer film as a PZT film having a film thickness of about 2 km.

Next, the upper electrode (the second electrode 17 in the present embodiment) was formed. First, an SrRuO₃ film (film thickness 40 nm) was formed as an oxide electrode film, and a platinum (Pt) film (film thickness 125 nm) was film-formed by sputtering as a metal electrode film. Then, a photoresist (TSMR 8800) manufactured by TOKYO OHKA KOGYO CO., LTD. was formed by a spin coat method. After forming a resist pattern by ordinary photolithography, a pattern as illustrated in FIG. 2 was produced using an TCP etching apparatus (manufactured by Samco Inc.).

At the time of producing the pattern, a pattern was formed to secure a distance of 4 μm between an edge of the second electrode 17 (upper electrode) made of platinum and an edge of the electromechanical transducer film 16. The edge of the second electrode 17 is an end of a patterned second electrode 17, and the edge of the electromechanical transducer film 16 is an end of an outermost surface of a patterned electromechanical transducer film 16. Securing the distance between the edge of the second electrode 17 and the electromechanical transducer film 16 can mainly reduce the surface leak.

Next, as the first insulating protective film 21, an Al₂O₃ film was film-formed to have a film thickness of 80 nm using an atomic layer deposition (ALD) method. At the time of forming the Al₂O₃ film, Al and O₃ are alternately laminated to progress a film formation. Aluminum (Al) is generated using trimethylaluminum (TMA: manufactured by Sigma-Aldrich Co. LLC), and oxygen (O) is generated by an ozone generator.

Then, as illustrated in FIG. 2, a contact hole 25 was formed by etching. Then, Al—Cu was film-formed by sputtering as a common-and-individual electrode lead wire (third electrode 27 and fourth electrode 28) and the film-formed Al—Cu was patterned by etching.

Next, Si₃N₄ was film-formed as the second insulating protective film 22 by plasma chemical vapor deposition (CVD) method to a film thickness of 500 nm. An opening was formed in the second insulating protective film 22, and a common electrode pad 23 and an individual electrode pad 24 to be connected to the common-and-individual electrode lead wire (third electrode 27 and fourth electrode 28) were formed. The distance between the individual electrode pads 24 was 80 μm.

The electromechanical transducer elements 20 were arranged such that 300 pieces of the electromechanical transducer elements 20 were arranged in one line in one chip.

Further, in the head 404 in the present embodiment includes a bonding-surface step 29 to bond a holding substrate to the electromechanical transducer element 20 as illustrated in FIGS. 2A and 2B.

The bonding-surface step 29 was disposed at a position corresponding to a partition wall of the pressure chamber 18. Further, the bonding-surface step includes a lamination of layers identical to the layers of each of first insulating protective film 21, the common-and-individual electrode lead wire (third electrode 27 and fourth electrode 28), and the second insulating protective film 22. The bonding-surface step was not disposed in an activation portion of electromechanical transducer element 20 and an outside a partition wall of the pressure chamber 18. Thus, the bonding-surface step does not affect a deformation area of the diaphragm 14.

Then, the polarization process was performed on the electromechanical transducer element 20 by corona charging process using the polarization processing device 40 as illustrated in FIGS. 3A and 3B.

A tungsten wire of φ50 μm was used as the corona electrode 41 for the corona charging process. A stainless-steel grid electrode having an aperture ratio of 60% was used as the grid electrode 42.

The polarization process was carried out at a process temperature of 80° C., a corona charge voltage of 9 kV, a grid voltage of 1.5 kV, a process time of 30 second, a distance between the corona electrode 41 and the grid electrode 42 of 4 mm, and a distance between the grid electrode 42 and the stage 43 of 4 mm.

[Fabrication of Liquid Discharge Head]

Then, the back surface of the substrate 13 is etched to form a pressure chamber 18 as illustrated in FIGS. 6A and 6B. The length (width) of the pressure chamber 18 in the transverse direction is 60 μm. The nozzle plate 12 in which the nozzle 11 was formed was joined to produce the head 404. The etching of the substrate 13 was performed after bonding the holding substrate in order to hold the pressure chamber 18.

The width of the opening of the holding substrate was 75 μm.

[Composition analysis]

(1) Average Pb Content

As a composition analysis of the electromechanical transducer film 16 (PZT film), contents of Pb, Zr and Ti were measured by ICP emission analysis. As a composition ratio of Pb, Zr and Ti, a sum of the contents of Zr and Ti contained in the electromechanical transducer film 16 was 100%, and the Pb content ratio to the sum of the contents of Zr and Ti was calculated as an average Pb content.

(2) Content Ratio of Crystal Grain Boundary Pb to Particle Pb

The Pb content of the side the particles and the Pb content of a region including the crystal grain boundaries are analyzed by TEM-EDS at any four points. The Pb content ratio (average value of measured four points) of the crystal grain boundaries to the Pb content of particles was calculated. The results are illustrated in Table 1.

[Pb Content Distribution in Film Thickness Direction]

Pb content of the electromechanical transducer film 16 (PZT film) as described above was measured up to 1000 μm every approximately 10 μm in the film thickness direction of the electromechanical transducer film 16. The measurement results are illustrated in a graph of FIG. 14

Figure 14:
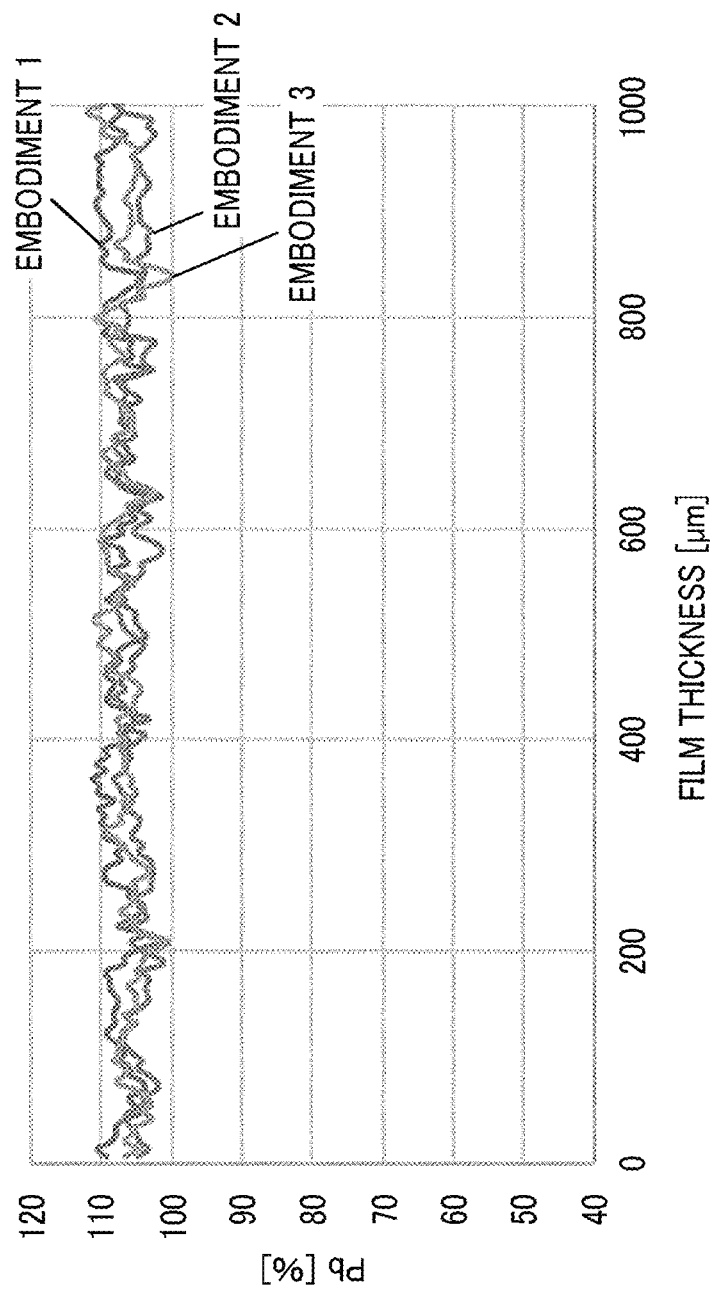
FIG. 14 is a graph illustrating a Pb content of an electromechanical transducer film in the electromechanical transducer element in Examples 1 to 3 in a film thickness direction.

The vertical axis of the graph in FIG. 14 indicates a content ratio (unit:%) of Pb/(Zr+Ti), and the horizontal axis indicates a position (unit: μm) from a film surface in the film thickness direction of the electromechanical transducer film 16. Further, Table 1 illustrates an evaluation of a Pb content distribution in which the Pb content ratio is measured in the film thickness direction of the electromechanical transducer film 16. In Table 1, Pb content distribution is evaluated as "substantially uniform (good)" when the Pb content ratio is within a range of 4% to an average value of Pb content, that is, a difference of the measured Pb content ratio is within a range of 8%.

[Evaluation of Electromechanical Transducer Characteristic]

(1) Evaluation of Dielectric Breakdown Voltage and Failure Occurrence Rate.

As a dielectric breakdown voltage, a leak current was measured while applying a voltage increased by 1V steps from 0 to 200V to the electromechanical transducer film 16 as a Time Zero Dielectric Breakdown (TZDB) evaluation. As a failure occurrence rate, failure occurrence rate was calculated while driving the electromechanical transducer film 16 at 1×10⁶ seconds with a DC voltage of 50V as a Time Dependence Dielectric Breakdown (TDDB) evaluation. The results are illustrated in Table 1.

A failure occurrence rate of less than 0.5% is evaluated as "excellent" as illustrated in Table 1. A failure occurrence rate of 0.5% or more and less than 1.0% is evaluated as "good" as illustrated in Table 1. A failure occurrence rate of 1.0% or more is evaluated as "Poor" as illustrated in Table 1. An electromechanical transducer element and a liquid discharge head having the failure occurrence rate of "Good" or "excellent" were determined as suitable for practical use.

(2) Measurement of Density of Leak Current and Density of Bulk-Leak Current. The density of leak current and the density of bulk-leak current are measured in a high humidity environment with a water vapor pressure of 300 kPa using a thermostatic chamber (manufactured by ESPEC Corp).

The water vapor pressure was derived by multiplying a saturated water vapor pressure with relative humidity. The saturated water vapor pressure is derived from following Wagner equation.

$$Pw = Pc \times \exp[(Ax + Bx^{3/2} + Cx^3 + Dx^6)/(1-x)], x = T/Tc \quad \text{[Equation 1]}$$

where:
Pc=22120 kPa:critical pressure,
Tc=647.3 K:critical temperature,
T=absolute temperature (K), and
A=−7.764451, B=1.45838, C=−2.7758, D=−1.23303

The density of leak current at a DC voltage of 40V was measured under the above-described environment. To measure the density of leak current, the leak current flowing through the bulk is digitized by changing only a peripheral length of the electrode while an electrode area is kept substantially equivalent with the third electrode 27 and the fourth electrode 28 to distinguish the electromechanical transducer element 20 from others.

At the same time, to measure the density of leak current, the current outside the electromechanical transducer element 20 is distinguished from the sheet resistance value of the second electrode 17, common-and-individual electrode lead wires (third electrode 27 and fourth electrode 28), and the second insulating protective film 22.

Further, the value of the density of leak current measured between the terminals is represented as "La", the density of bulk-leak current flowing in the electromechanical transducer film 16 is represented as "Lb". The value of Lb/La is calculated. The results are illustrated in Table 1.

(3) Piezoelectric Constant d31

An amount of displacement of the electromechanical transducer element 20 at an electric field intensity of 150 kV/cm was measured by a laser Doppler vibrometer. The piezoelectric constant d31 is calculated based on the measured amount of displacement. The results are illustrated in Table 1.

Example 2

An example 2 is indicated as "EX2" in Table 1.

An electromechanical transducer element and a liquid discharge head were manufactured as in the same conditions with the Example 1 except that a PZT precursor solution was film-formed by spin coating to form a laminated film, and a third layer was subjected to pyrolysis, and then was subjected to a crystallization heat treatment with temperature of 730° C. for 10 minutes.

Further, in the same manner as in Example 1, the composition analysis, the measurement of Pb content distribution in the film thickness direction, and evaluation of electromechanical transducer characteristic were performed.

The results are illustrated in Table 1. Also, the measurement results of the Pb content distribution in the film thickness direction are illustrated in FIG. 14.

Example 3

An example 3 is indicated as "EX3" in Table 1.

An electromechanical transducer element and a liquid discharge head were produced in the same manner as in Example 1 except that the first insulating protective film 21 was changed to an aluminum nitride (AlN) film.

Further, in the same manner as in Example 1, the composition analysis, the measurement of Pb content distribution in the film thickness direction, and evaluation of electromechanical transducer characteristic were performed.

The results are illustrated in Table 1. Also, the measurement results of the Pb content distribution in the film thickness direction are illustrated in FIG. 14.

Example 4

An example 4 is indicated as "EX4" in Table 1.

An electromechanical transducer element and a liquid discharge head were produced as in the same manner as in Example 1 except that the pattern is formed to secure a distance of 1 μm between the edge of the common-and-individual electrode lead wire (third electrode 27 and fourth electrode 28) and the edge of the electromechanical transducer film 16.

Further, the composition analysis, the evaluation of Pb content distribution in the film thickness direction, and the evaluation of electromechanical transducer characteristic were performed in the same manner as in Example 1. The results are illustrated in Table 1.

Comparative Example 1

A comparative example 1 is indicated as "CE1" in Table 1.

An electromechanical transducer element and a liquid discharge head were produced in the same manner as in Example 1 except that a PZT precursor solution 2 (Pb:Zr:Ti=115:53:47) was used as a PZT precursor solution, and was film-formed by spin coating, and then was subjected to a crystallization heat treatment with temperature of 700° C. for three minutes after subjected to pyrolysis.

Further, the composition analysis and the electromechanical transducer characteristic were evaluated in the same manner as in Example 1.

The results are illustrated in Table 1.

Comparative Example 2

A comparative example 2 is indicated as "CE2" in Table 1.

An electromechanical transducer element and a liquid discharge head were produced in the same manner as in Example 1 except that a PZT precursor solution 2 (Pb:Zr:Ti=115:53:47) was used as a PZT precursor solution, and was film-formed by spin coating, and then was subjected to a crystallization heat treatment with temperature of 730° C. for three minutes after subjected to pyrolysis.

Further, the composition analysis and the electromechanical transducer characteristic were evaluated in the same manner as in Example 1. The results are illustrated in Table 1.

As described above, it was confirmed that the electromechanical transducer elements of Examples 1 to 4 can maintain electromechanical transducer characteristics even in a high humidity environment and continue driving without failure. Thus, the electromechanical transducer elements of Examples 1 to 4 have high reliability.

Conversely, in Comparative Examples 1 and 2, the value of the density of leak current was very large (larger than $5.0 \times 10^{-6}$ A/cm$^2$), and the failure occurrence rate was also very small, such as 2.0% or more. Further, a failure occurred within about five hours from the start of driving of the electromechanical transducer element 20.

Numerous additional modifications and variations are possible in light of the above teachings. Such modifications and variations are not to be regarded as a departure from the scope of the present disclosure and appended claims, and all such modifications are intended to be included within the scope of the present disclosure and appended claims.

TABLE 1

| | COMPOSITION ANALYSIS | | | EVALUATION OF ELECTROMECHANICAL TRANSDUCER CHARACTERISTICS | | | | | |
|---|---|---|---|---|---|---|---|---|---|
| | Average ratio of Pb content (Pb/Zr + Ti) | Pb content distribution | Ratio of Pb content (Grain boundaries/particles) | Dielectric breakdown voltage | Failure occurrence rate | | Density of leak current (La) | Density of bulk-leak current (Lb) | Lb/La | Piezo-electric constant d31 |
| | [%] | | [%] | [V] | [%] | Evaluation | [A/cm$^2$] | [A/cm$^2$] | | [pm/V] |
| EX1 | 108.2 | Good | 103.6 | 156 | 0 | Excellent | $1.2 \times 10^{-6}$ | $4.6 \times 10^{-7}$ | 0.38 | −149 |
| EX2 | 106.1 | Good | 102.2 | 171 | 0 | Excellent | $1.5 \times 10^{-6}$ | $4.8 \times 10^{-7}$ | 0.32 | −147 |
| EX3 | 107.7 | Good | 103.6 | 153 | 0 | Excellent | $1.5 \times 10^{-6}$ | $5.2 \times 10^{-7}$ | 0.37 | −146 |
| EX4 | 108.2 | Good | 103.3 | 97 | 0.6 | Good | $4.2 \times 10^{-6}$ | $4.4 \times 10^{-7}$ | 0.10 | −149 |
| CE1 | 113.6 | — | 108.6 | 149 | 2.4 | Poor | $5.1 \times 10^{-6}$ | $1.8 \times 10^{-6}$ | 0.35 | −118 |
| CE2 | 110.6 | — | 105.6 | 152 | 2.2 | Poor | $5.3 \times 10^{-6}$ | $2.0 \times 10^{-6}$ | 0.37 | −127 |

"Good" in Pb content distribution in Table 1 indicates that the Pb content distribution is substantially uniform, and "-(hyphen)" indicates that the evaluation is not performed or the Pb content distribution is not uniform.

"Excellent" in the failure occurrence rate in Table 1 indicates that the failure occurrence rate is very low, "Good" indicates that the failure occurrence rate is low, and "Poor" indicates that the failure occurrence rate is high. An electromechanical transducer element and a liquid discharge head having the failure occurrence rate of "Good" or "Excellent" is suitable for practical use.

As illustrated in Table 1, the electromechanical transducers elements of Examples 1 to 4 had the density of leak current of $4.2 \times 10^{-6}$ A/cm$^2$ or less and had a substantially uniform Pb content of the electromechanical transducer film 16 (PZT film) in the film thickness direction. The density of leak current was measured between the terminals electrically connected from the pair of electrodes in an environment with a water vapor pressure of 300 kPa. The electromechanical transducers elements of Examples 1 to 3 had the density of leak current of $1.5 \times 10^6$ A/cm$^2$ or less.

Further, it can be seen from Table 1 that the value of the density of bulk-leak current (Lb) and the value of the density of leak current (La) satisfied the relationship of Lb/La≥0.30 in the electromechanical transducer elements of Examples 1 to 4. Thus, the leak current of the electromechanical transducer elements of Examples 1 to 4 was very small.

The average Pb content of the electromechanical transducer elements of Examples 1 to 4 was from 100.0 to 110.0% (more preferably from 100 to 108%) and a ratio of the Pb content of the crystal grain boundaries to the Pb content of the side the particles was less than 105% (more preferably 103% or less). The above-described conditions may contribute to a reduction in the bulk-leak current such as $5.2 \times 10^{-7}$ A/cm$^2$ or less. The above-described values were achieved by setting firing conditions so that the lead titanate and lead zirconate in PZT sufficiently dissolve in the firing process.

Further, the value of the dielectric breakdown voltage of the electromechanical transducer elements of Examples 1 to 4 was sufficiently high, such that the failure occurrence rate was less than 1.0%, and the value of the piezoelectric constant d31 was also good (less than −140).

What is claimed is:

1. An electromechanical transducer element comprising:
    an electromechanical transducer film including a complex oxide that has a perovskite structure containing at least Pb, Zr and Ti;
    a pair of electrodes to sandwich the electromechanical transducer film; and
    an insulating protective film to cover the electromechanical transducer film and the pair of electrodes,
    wherein a Pb content of the electromechanical transducer film is uniform in a film thickness direction of the electromechanical transducer film, and
    a density of leak current measured between the pair of electrodes is $4.2 \times 10^{-6}$ A/cm$^2$ or less in an environment in which a water vapor pressure is 300 kPa.

2. The electromechanical transducer element according to claim 1,
    wherein
    a relation of Lb/La>0.30 is satisfied,
    wherein La represents a value of the density of leak current measured between the pair of electrodes, and Lb represents a value of a density of bulk-leak current flowing in the electromechanical transducer film.

3. The electromechanical transducer element according to claim 1,
    wherein the electromechanical transducer element has a dielectric strength of 100V or more.

4. The electromechanical transducer element according to claim 1, wherein an average Pb content of the electromechanical transducer film is from 100% to 110% of Zr and Ti content combined.

5. The electromechanical transducer element according to claim 1,
wherein the electromechanical transducer film has a plurality of particles and a crystal grain boundary between the plurality of particles, and
a Pb content of an area including the crystal grain boundary is less than 105% of a Pb content inside the plurality of particles.

6. The electromechanical transducer element according to claim 1,
wherein the insulating protective film is made of one of aluminum oxide, silicon oxide, aluminum nitride, and silicon nitride.

7. The electromechanical transducer element according to claim 1,
wherein the electromechanical transducer film is a crystal film preferentially oriented to a (100) plane, and
crystal particles of the electromechanical transducer film are columnar crystal particles grown in the film thickness direction.

8. A liquid discharge head comprising the electromechanical transducer element according to claim 1.

9. A liquid discharge device comprising the liquid discharge head according to claim 8.

10. The liquid discharge device according to claim 9, further comprising at least one of:
a head tank to store the liquid to be supplied to the liquid discharge head;
a carriage to mount the liquid discharge head;
a supply device to supply the liquid to the liquid discharge head;
a maintenance device to maintain the liquid discharge head; and
a drive device to move the carriage in a main scanning direction, together with the liquid discharge head to form a single unit.

11. A liquid discharge apparatus comprising the liquid discharge device according to claim 9.

12. A piezoelectric device comprising the electromechanical transducer element according to claim 1.

13. The electromechanical transducer element according to claim 1, wherein the electromechanical transducer film is formed on a single crystal silicon substrate.

* * * * *